United States Patent [19]
Takano

[11] Patent Number: 5,889,699
[45] Date of Patent: Mar. 30, 1999

[54] NON-VOLATILE SEMICONDUCTOR MEMORY DEVICE

[75] Inventor: Yoh Takano, Gifu-ken, Japan

[73] Assignee: Sanyo Electric Co., Ltd., Osaka, Japan

[21] Appl. No.: 805,015

[22] Filed: Feb. 24, 1997

[30] Foreign Application Priority Data

Feb. 26, 1996 [JP] Japan ..................................... 8-038247

[51] Int. Cl.⁶ ...................................................... G11C 7/00
[52] U.S. Cl. ............................... 365/185.18; 365/185.21; 365/185.22; 365/189.09; 365/207
[58] Field of Search .............................. 365/185.18, 207, 365/189.09, 185.22, 185.21

[56] References Cited

U.S. PATENT DOCUMENTS 5,029,130  7/1991  Yeh ......................................... 365/185
5,587,947  12/1996  Chang et al. ................... 365/185.18 X

FOREIGN PATENT DOCUMENTS

07029383 A  1/1995  Japan .
WO 92/18980  10/1992  WIPO .

OTHER PUBLICATIONS

"An Experimental 1.5–V 64–Mb DRAM" by Nakagome et al., IEEE Journal of Solid–State Circuits, vol. 26, No. 4, Apr. 1991, pp. 465–472.

*Primary Examiner*—Do Hyun Yoo
*Attorney, Agent, or Firm*—Sheridan Ross P.C.

[57] ABSTRACT

A non-volatile semiconductor memory device that accurately writes and reads multivalue data to and from memory cells includes a control unit and a plurality of memory cells each having a control gate, a source, a drain and a floating gate. The floating gate has an electric potential controllable by applying predetermined voltages to the control gate, the source and the drain. The control unit controls the electric potential of the floating gate to write predetermined data in the memory cells. The predetermined data corresponds to one of a plurality of preset electric potential ranges of the floating gate. The electric potential of the floating gate is controlled to lie in one of the plurality of electric potential ranges of the floating gate corresponding to the predetermined data. Each of the memory cells is activatable when the floating gate has either a higher potential or a lower potential than a predetermined electric potential. The control unit controls the electric potential of the floating gate such that one of the plurality of potential ranges of the floating gate corresponding to the predetermined data is shifted near the predetermined electric potential of the floating gate. The predetermined data written in each of the memory cells is read by determining if the memory cells have been activated.

22 Claims, 20 Drawing Sheets

Fig.5 (Prior Art)

| Operation mode | Write | Erase | Read | Stand-by |
|---|---|---|---|---|
| Word line WLm (Control gate CG) | +1V | +15V | +5V | 0V |
| Bit line BLm (Drain D) | +12V | 0V | +2.5V | 0V |
| Common source line SL (Source S) | 0V | 0V | 0V | 0V |
| Substrate 102 | 0V | 0V | 0V | 0V |

Fig.6 (Prior Art)

| Operation mode | Write | Erase | Read | Stand-by |
|---|---|---|---|---|
| Word line WLm (Control gate CG) | +1V | +15V | +5V | 0V |
| Bit line BLm (Drain D) | 0V | 0V | +2.5V | 0V |
| Common source line SL (Source S) | +12V | 0V | 0V | 0V |
| Substrate 102 | 0V | 0V | 0V | 0V |

Fig.16 (Prior Art)

| Operation mode | Write | Erase | Read | Stand-by |
|---|---|---|---|---|
| Word line WLm (Control gate CG) | +12V | 0V | +5V | 0V |
| Common drain line DL (Drain D) | 0V | +12V | +5V | 0V |
| Bit line BLm (Source S) | +5V | OPEN | 0V | 0V |
| Substrate 202 | 0V | 0V | 0V | 0V |

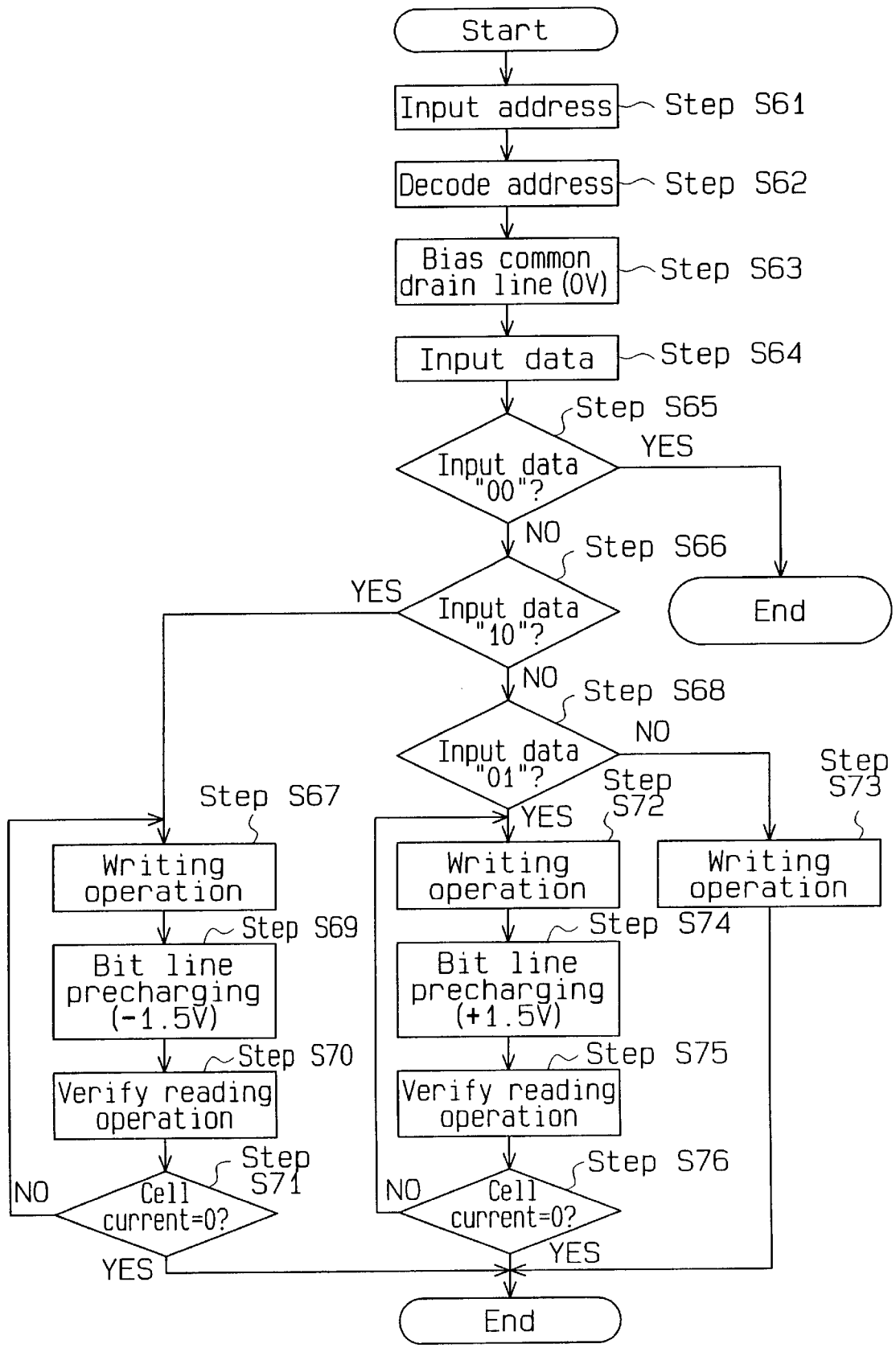

NON-VOLATILE SEMICONDUCTOR MEMORY DEVICE

BACKGROUND OF THE INVENTION

1. Field of the Invention

The present invention relates generally to non-volatile semiconductor memory devices. More particularly, this invention relates to flash Electrical Erasable and Programmable Read Only Memories (EEPROMs).

2. Description of the Related Art

Great attention has recently been paid to non-volatile semiconductor memories, such as Ferro-electric Random Access Memories, Erasable and Programmable Read Only Memories (EPROMs) and EEPROMs. As is well known in the art, EPROMs and EEPROMs use floating gates for storing charges that define stored data and control gates for detecting a change in the threshold voltages based on the presence or absence of charges. In addition, EEPROMs include flash EEPROMs that are capable of performing data erasures for all memory storage areas or a plurality of data erasures for selected block storage areas. In general, there are two types of memory cells in a flash EEPROM: one is a split gate type and the other is a stack gate type. International Patent Publication WO92/18980 and U.S. Pat. No. 5,029,130 disclose a split gate flash EEPROM.

In flash EEPROMs, efforts have been made to ensure a multi-value storage operation. The multi-value storage operation generally stores data having three or more values as well as data having two values indicating an erased state and a written state, (i.e., the storage of 1-bit data in one memory cell).

FIG. 1 is a characteristic graph showing the relationship between the cell current that flows in split gate memory cells and the electric potential of a floating gate (hereinafter frequently referred to as "floating gate potential") in each memory cell. In the figure, the floating gate potential indicates the electric potential of the floating gate with respect to the source in each memory cell and is closely associated with the cell current. As apparent from this graph, multi-value data of, for example, four values ("00", "01", "10" and "11") can be stored in each memory cell by associating the individual ranges of a specific current value Id with the individual values of the multivalue data.

In a specific range of the floating gate potential (+0.5 to +2.5 V), the cell current value Id shows a relatively large change. Therefore, the cell current value Id is primarily associated with the floating gate potential Vfg, thus permitting the individual values of multivalue data to be respectively associated with the individual ranges of a specific cell current value Id. When the floating gate potential is less than +0.5 V or equal to or greater than +3.5 V, the cell current is held at a substantially constant value, thus disabling the association of the data values with the cell current values.

FIG. 2 is a characteristic graph showing the relationship between the cell current that flows in stacked gate memory cells and the electric potential of a floating gate in each memory cell. In this type of memory cell, when the floating gate potential Vfg is less than the threshold voltage of the memory cells (about +1 V), the cell current value Id shows zero. When the floating gate potential exceeds the threshold voltage, the cell current value Id is positively proportional to the floating gate potential Vfg, so that multivalue data can be stored in the memory cells.

When the floating gate potential is less than +1 V, however, the cell current value becomes substantially constant, so that the data values can no longer be associated with the cell current values. When the supply voltage is +5 V and the floating gate potential is +6 V or greater, the stacked gate memory cells would suffer the inherent problem of excess erasure, which is undesirable for storage of multivalue data. This excess erasure occurs as charges are excessively drained from the floating gate in an erase mode. Any excessively erased memory cell is turned on even in a standby mode, permitting the flow of the cell current. Consequently, this increases the power consumption. That is, even though a predetermined voltage (0 V) is applied to the control gate of that excessively erased memory cell to turn it off in the standby mode, the channel, or the memory cell, is turned on. Further, even though a voltage of about +5 V is applied to the control gate in an operation of reading the excessively erased memory cell, the electric potential of the floating gate that is capacitively coupled to that control gate is pulled up to or above +6 V. In other words, the value obtained by subtracting the supply voltage $V_{cc}$ from the floating gate potential Vfg for the excessively erased memory cell exceeds the threshold voltage Vth (i.e., Vfg−$V_{cc}$>Vth).

To prevent a data write error in the writing operation or a read error in the reading operation, it is preferable that the individual ranges of the floating gate potential and the cell current value associated with the individual values of multivalue data should have enough margin. In flash EEPROMs, which use split gate memory cells and stacked gate memory cells, however, the suitable cell current values for storing multivalue data are limited to certain ranges due to the reasons given above, making it difficult to ensure such sufficient margin.

In split gate memory cells, for example, the range of the cell current value associated with each data value is 40 $\mu$A, the range of the floating gate potential for the data value of "10" is 0.5 V, and the range of the floating gate potential for the data value of "01" is 1 V. In stacked gate memory cells, the range of the cell current value associated with each data value is 40 $\mu$A, and the range of the floating gate potential for each data value is 1.25 V.

As the individual ranges of the floating gate potential are relatively narrow, it is difficult to ensure a sufficient margin to accurately set the floating gate potential in the writing operation. As the individual ranges of the cell current value are relatively narrow, it is difficult to ensure a sufficient margin to accurately read the cell current value in the reading operation.

As the number of multivalues increases to eight or sixteen, the individual ranges of the floating gate potential and the cell current value for individual data values become narrower as compared with the case of four values, and thus achieving a sufficient margin becomes more difficult.

Japanese Unexamined Patent Publication No. 7-29383 discloses a ROM from which multivalue data is read by performing the reading operation as separate tasks while changing the voltage to be applied to the word lines. When different multivalue data are stored in a plurality of memory cells connected to a single word line in such a ROM, the reading operation must be performed for each multivalue data in order to read data from those memory cells. In other words, a reading operation must be performed for each of the different multivalue data. Further, while this reading technique can be adapted to a ROM, it is not certain that the reading technique can be adapted to reading and writing data from and to a flash EEPROM.

SUMMARY OF THE INVENTION

Accordingly, it is primary object of the present invention to provide a non-volatile semiconductor memory device that can accurately write and read multivalue data to and from memory cells. The present invention can be implemented in numerous ways including as an apparatus and a method.

In one aspect of the invention, a non-volatile semiconductor memory device includes a control unit and a plurality of memory cells each having a control gate, a source, a drain and a floating gate. The floating gate has an electric potential controllable by applying predetermined voltages to the control gate, the source and the drain. The control unit controls the electric potential of the floating gate to write predetermined data in the memory cells. The predetermined data corresponds to one of a plurality of preset electric potential ranges of the floating gate. The electric potential of the floating gate is controlled so as to lie in one of the plurality of electric potential ranges of the floating gate corresponding to the predetermined data. Each of the memory cells is activatable when the floating gate has either a higher potential or a lower potential than a predetermined electric potential. The control unit reads the predetermined data written in each of the memory cells by controlling the electric potential of the floating gate such that one of the plurality of potential ranges of the floating gate corresponding to the predetermined data is shifted near the predetermined electric potential of the floating gate and by determining if the memory cells have been activated.

The plurality of potential ranges of the floating gate include a plurality of first electric potential ranges previously set on a higher potential side than the predetermined electric potential of the floating gate and a plurality of second electric potential ranges previously set on a lower potential side than the predetermined electric potential. The predetermined electric potential of the floating gate preferably corresponds to a threshold voltage of each of the memory cells.

A current flows in each of the memory cells when activated. The control unit reads the predetermined data written in each of the memory cells by determining if a current is flowing in each memory cell. The control unit may read the predetermined data written in each of the memory cells by determining if a current is flowing in the each memory cell and by determining the level of current flowing in each memory cell.

In another aspect of the invention, a non-volatile semiconductor memory device includes a control unit and a plurality of memory cells each having a control gate, a source, a drain and a floating gate. The floating gate has an electric potential controllable by applying predetermined voltages to the control gate, the source and the drain. The control unit controls the electric potential of the floating gate to write predetermined data including upper bit data and lower bit data in the memory cells. Each of the upper bit data and the lower bit data has either a first or a second value. The predetermined data, which includes upper bit data having the first value and lower bit data having either the first or the second value, corresponds to one of a plurality of first electric potential ranges previously set on a higher potential side than a predetermined electric potential of the floating gate. The predetermined data, which includes upper bit data having the second value and lower bit data having either the first or the second value, corresponds to one of a plurality of second electric potential ranges previously set on a lower potential side than the predetermined electric potential of the floating gate. The electric potential of the floating gate is controlled so as to lie in one of the plurality of first and second potential ranges of the floating gate corresponding to the predetermined data. Each of the memory cells is activatable when the floating gate has either a higher potential or a lower potential than the predetermined electric potential.

In a read mode for reading the predetermined data written in each of the memory cells, the control unit controls the electric potential of the floating gate to determine if the upper bit data has the first value or the second value based on whether or not the memory cells have been activated. The control unit further performs either up control or down control of the electric potential of the floating gate based on the result of a decision on the value of the upper bit data such that one of the plurality of first and second potential ranges of the floating gate corresponding to the predetermined data to be written is shifted near the predetermined electric potential of the floating gate in order to determine if the lower bit data has the first value or the second value based on whether or not the memory cells have been activated.

In a reading operation for verifying the predetermined data written in each of the memory cells, the control unit may perform either up control or down control of the electric potential of the floating gate such that one of the plurality of first and second potential ranges of the floating gate corresponding to the predetermined data to be written is shifted near the predetermined electric potential of the floating gate in order to determine if the predetermined data has been written based on whether or not the memory cells have been activated.

The predetermined electric potential of the floating gate preferably corresponds to a threshold voltage of each of the memory cells. A current flows in each of the memory cells when activated. Each pair of adjacent potential ranges in the plurality of first and second potential ranges of the floating gate are distinguished by a boundary potential. In the read mode, the control unit performs either up control or down control of the electric potential of the floating gate such that the characteristic curve is shifted in a positive direction or a negative direction, so that the boundary potential substantially matches with the predetermined electric potential in order to determine if the lower bit data has the first value or the second value in accordance with whether a current is flowing in each memory cell.

In the reading operation, the control unit may perform either up control or down control of the electric potential of the floating gate such that the characteristic curve is shifted in a positive direction or a negative direction so that the middle electric potential of one of the plurality of first and second potential ranges of the floating gate corresponding to the predetermined data to be written substantially matches with the predetermined electric potential in order to verify if the predetermined data has been written in accordance with whether a current is flowing in each memory cell.

In the reading operation, the control unit may perform either up control or down control of the electric potential of the floating gate when the predetermined data to be written includes predetermined data including upper bit data having the first value and lower bit data having the second value or predetermined data including upper bit data having the second value and lower bit data having the first value.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5 is a diagram for explaining voltage control in the individual operational modes of a first type of flash EEPROM in FIG. 4;

FIG. 6 is a diagram for explaining voltage control in individual operational modes of a second type of flash EEPROM;

FIG. 16 is a diagram for explaining the individual operational modes of the flash EEPROM in FIG. 15;

FIG. 20 is a flowchart illustrating the operation of the flash EEPROM according to the third embodiment in a write mode.

DETAILED DESCRIPTION OF THE PREFERRED EMBODIMENTS

Figure 3:
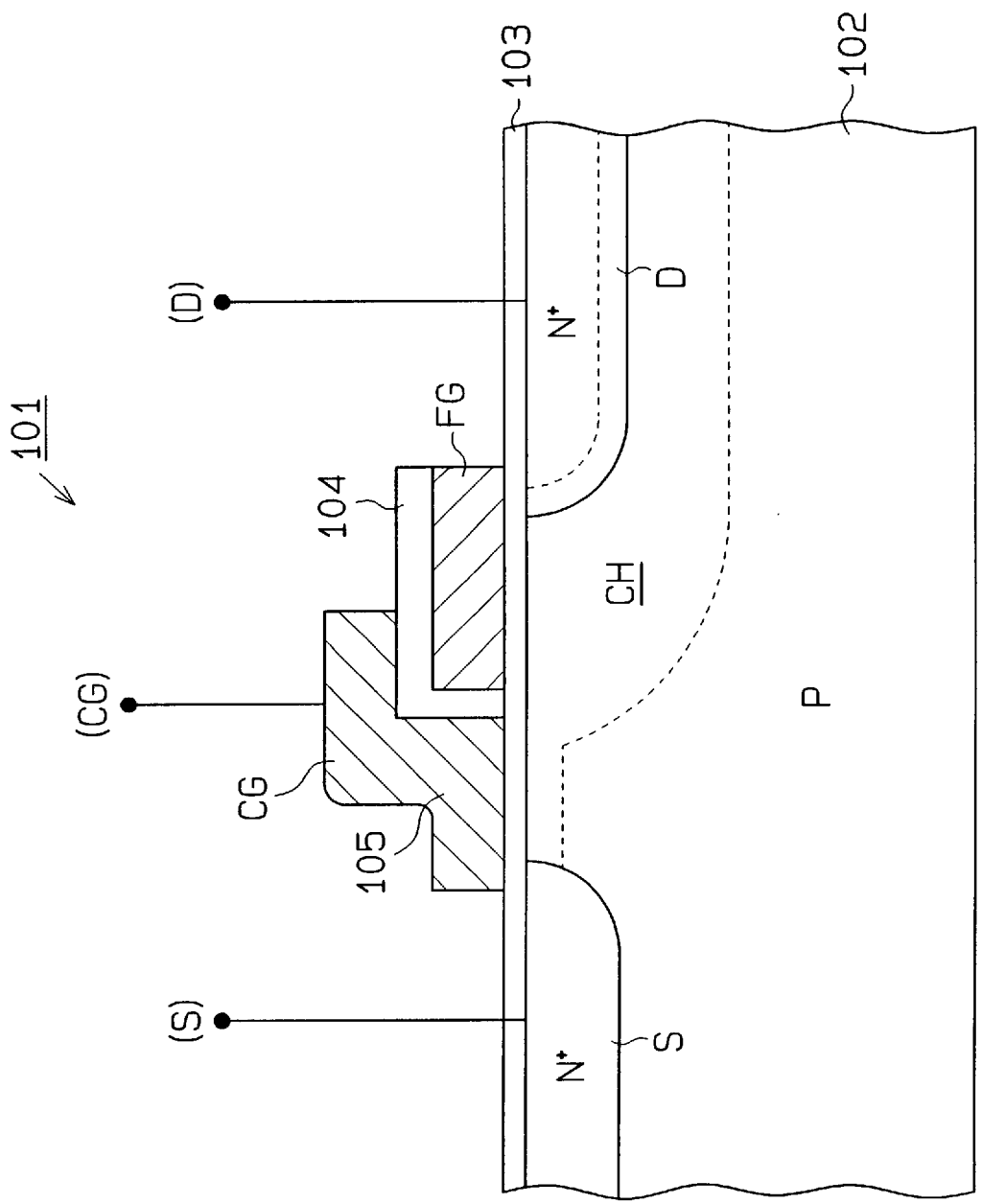
FIG. 3 is a schematic cross-sectional view of a split gate memory cell.

A non-volatile semiconductor memory device according to one embodiment of the present invention will now be described with reference to the accompanying drawings. FIG. 3 is a cross-sectional view schematically illustrating a conventional split gate memory cell 101 disclosed in U.S. Pat. No. 5,029,130. The split gate memory cell 101 has a source S of an N-type conductivity and a drain D of the N-type conductivity, both defined on a single crystalline silicon substrate 102 having a P-type conductivity, a floating gate FG provided on a first insulator film 103 over a channel CH between the source S and drain D, and a control gate CG provided on a second insulator film 104 over the floating gate FG. A part of the control gate CG is arranged as a select gate 105 on the first insulator film 103 over the channel CH, and the remaining part of the control gate CG is arranged on the second insulator film 104 over the floating gate FG.

Figure 4:
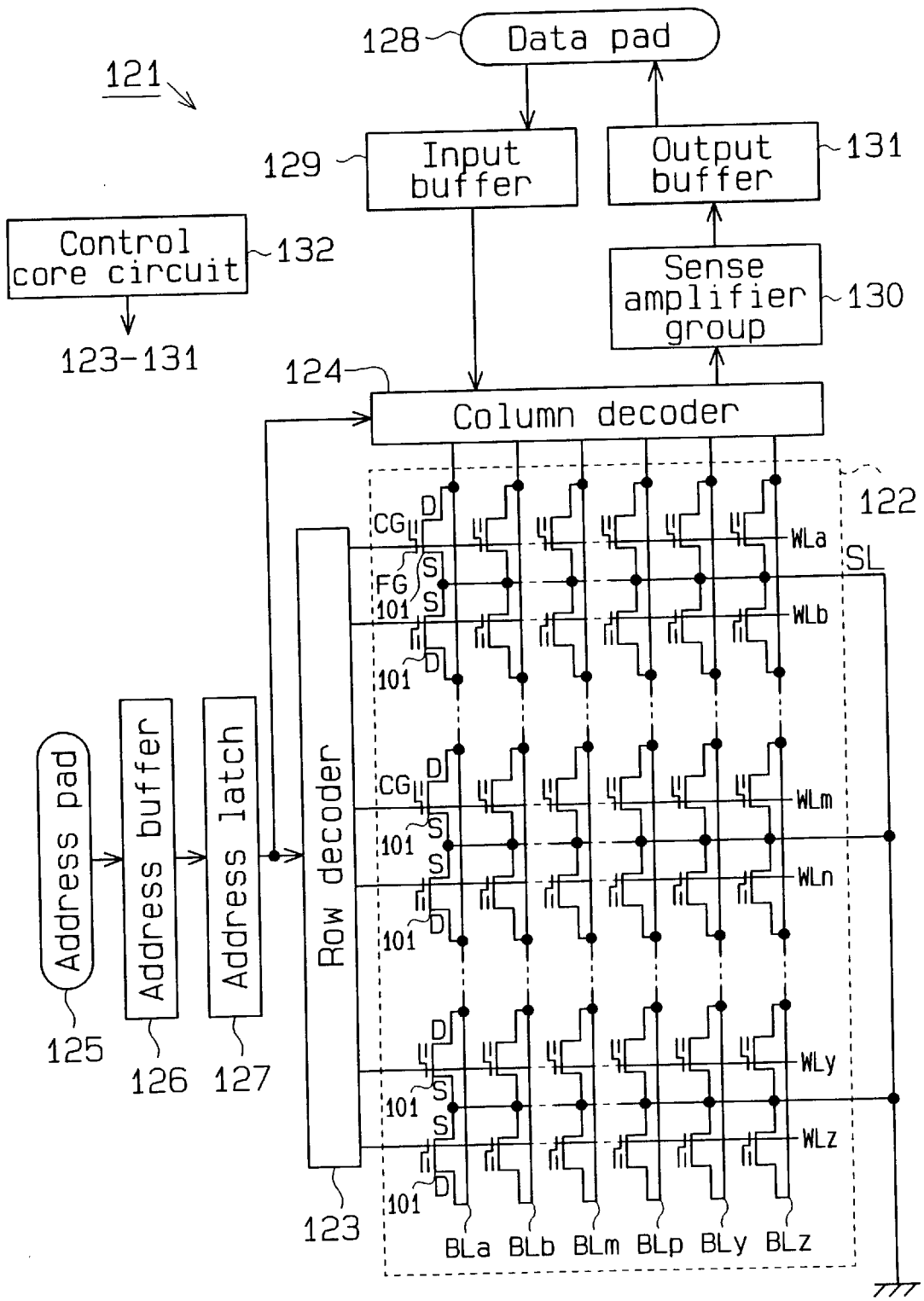
FIG. 4 is a block diagram showing a conventional flash EEPROM having a plurality of split gate memory cells in FIG. 3.

FIG. 4 is a block diagram showing a conventional flash EEPROM 121 having a plurality of split gate memory cells 101. The flash EEPROM 121 includes a memory cell array 122, a row decoder 123, a column decoder 124, an address pad 125, an address buffer 126, an address latch 127, a data pad 128, an input buffer 129, a sense amplifier group 130, an output buffer 131 and a control core circuit 132.

The memory cell array 122 has a matrix of split gate memory cells 101, a plurality of word lines WLa to WLz each commonly connected to the control gates CG of an associated row of memory cells 101, a plurality of bit lines BLa to BLz each commonly connected to the drains D of an associated column of memory cells 101, and source line SL connected to the sources of all memory cells. The source line SL is connected to a ground.

The address pad 125 receives a row address and a column address supplied from an external unit (not shown) and then supplies those addresses to the address buffer 126. The address buffer 126 transfers the row address and column address to the address latch 127. The address latch 127 latches those addresses and transfers the row address to the row decoder 123 and the column address to the column decoder 124. The row decoder 123 selects one word line in accordance with the row address and controls the voltage applied to the selected word line WLm in accordance with the individual operation modes shown in FIG. 5. The column decoder 124 selects one bit line in accordance with the column address and controls the voltage applied to the selected bit line in accordance with the individual operation modes.

The data pad 128 receives data supplied from the external unit (not shown) and supplies the data to the input buffer 129. The input buffer 129 transfers the data to the column decoder 124. The column decoder 124 controls the voltage applied to any selected one of the bit lines BLa–BLz according to that data. Data read from an arbitrary memory cell 101 is transferred from the selected bit line to the sense amplifier group 130 via the column decoder 124. The sense amplifier group 130 includes a plurality of sense amplifiers (not shown). The column decoder 124 operates so as to connect the selected bit line to the sense amplifiers. The sense amplifier group 130 discriminates the data and supplies it to an output buffer 131. The output buffer 131 supplies the data to the data pad 128. The thus read data is supplied from the data pad 128 to an external unit.

The control core circuit 132 controls the operations of the row decoder 123, the column decoder 124, the address pad 125, the address buffer 126, the address latch 127, the data pad 128, the input buffer 129, the sense amplifier group 130 and the output buffer 131.

In this specification, the names for the source S and the drain D of the split gate memory cell 101 are determined based on the reading operation; the terminal to which a high voltage is applied in the reading operation is called "drain" while the terminal to which a low voltage is applied is called "source". The same applies to the determination of the names for those terminals, the source S or the drain D, even if the writing operation and the erasing operation.

The individual operation modes (erase mode, write mode and read mode) of the flash EEPROM 121 will now be discussed with reference to FIG. 5.

(a) Erase Mode

In erase mode, a voltage of the ground level (=0 V) is applied to all the bit lines BLa–BLz. A voltage of about +15 V is applied to a selected word line WLm and a voltage of the ground level is applied to the other, non-selected word lines WLa–WL1 and WLn–WLz. Therefore, data is erased from all the memory cells 101 that are connected to the selected word line WLm as the electric potentials of the control gates CG of those memory cells 101 are pulled up to about +15 V.

When the electric potential of the control gate CG is about +15 V and the electric potential of the drain is 0 V, a high electric field is produced between the control gate CG and the floating gate FG so that a Fowler-Nordheim (FN) tunnel current flows between those gates. Consequently, electrons in the floating gate FG are pulled out to the control gate CG, resulting in data erasure. This erasing operation is based on the fact that the electrostatic capacitance between the drain D and the floating gate FG is significantly greater than that between the control gate CG and the floating gate FG. Simultaneous selection of a plurality of word lines WLa–WLz allows for data erasure of all the memory cells 101 that are connected to the selected individual word lines. This erasure is called "block erasure".

(b) Write Mode

In write mode, a voltage of about +1 V is applied to a selected word line WLm, and a voltage of the ground level is applied to the other, non-selected word lines WLa–WL1 and WLn–WLz. A voltage of about +12 V is applied to a selected bit lines BLm, and a voltage of ground level is applied to the other, non-selected bit lines BLa–BL1 and BLn–BLz. Consequently, the electric potential of the floating gate FG is pulled up by the capacitive coupling between the source S and the floating gate FG, thus producing a high electric field between the control gate CG and the floating gate FG. Thus, the electrons in the channel CH are accelerated to become hot electrons which are supplied to the floating gate FG. As a result, charges are stored in the floating gate FG of the selected memory cell 101 and 1-bit data is written.

It is noted that each memory cell 101 has a threshold voltage Vth of +0.5 V and includes a transistor, which includes a control gate CG, source S and drain D. Therefore, electrons in the source S are moved in the channel CH in the weakly inverted state from P to N, so that the cell current flows to the drain D from the source S.

(c) Read Mode

In read mode, a voltage of about +5 V is applied to a selected word line WLm, and the voltage of the ground level is applied to the other, non-selected word lines WLa–WL1 and WLn–WLz. A voltage of +2.5 V is applied to a selected bit line BLm and the voltage of the ground level is applied to the other, non-selected bit lines BLa–BL1 and BLn–BLz. As a result, the cell current which flows to the source S of the memory cell 101 in the erased state from the drain D becomes greater than the cell current flowing in the memory cell 101 in the written state. This is because the channel CH directly below the floating gate FG of the data-erased memory cell is enabled, while the channel CH directly below the floating gate FG of the data-written memory cell is disabled in the memory cell in the written state.

More specifically, because electrons are drained from the floating gate FG of a data-erased memory cell, the floating gate FG is positively charged. Therefore, the channel CH or the memory cell is enabled so that a current flows. As electrons are supplied into the floating gate FG of a data-written memory cell, the floating gate FG is negatively charged. The channel CH or memory cell is thus disabled so that a current does not flow. A NPN split gate type memory cell is used as the memory cell 101. A PNP split gate type memory cell may be used as the memory cell 101. In this case, the channel CH or memory cell is disabled so that a current does not flow when the floating gate FG has a high electric potential. In opposition, the channel CH or the memory cell is enabled so that a current flows when the floating gate FG has a low electric potential.

Each sense amplifier in the sense amplifier group 130 discriminates the level of the cell current flowing in the associated memory cell as erase data "1" or write data "0". In this manner, binary data having a data value "1" indicating the erased state and a data value "0" indicating the written state may be stored in each memory cell.

International Patent Publication WO92/18980 discloses a flash EEPROM in which the source S of the split gate memory cell 101 is identified as a "drain" and the drain D is identified as a "source". FIG. 6 shows voltages applied to a selected word line, a selected bit line, the common source line and the substrate in the individual operation modes of the flash EEPROM.

Figure 1:
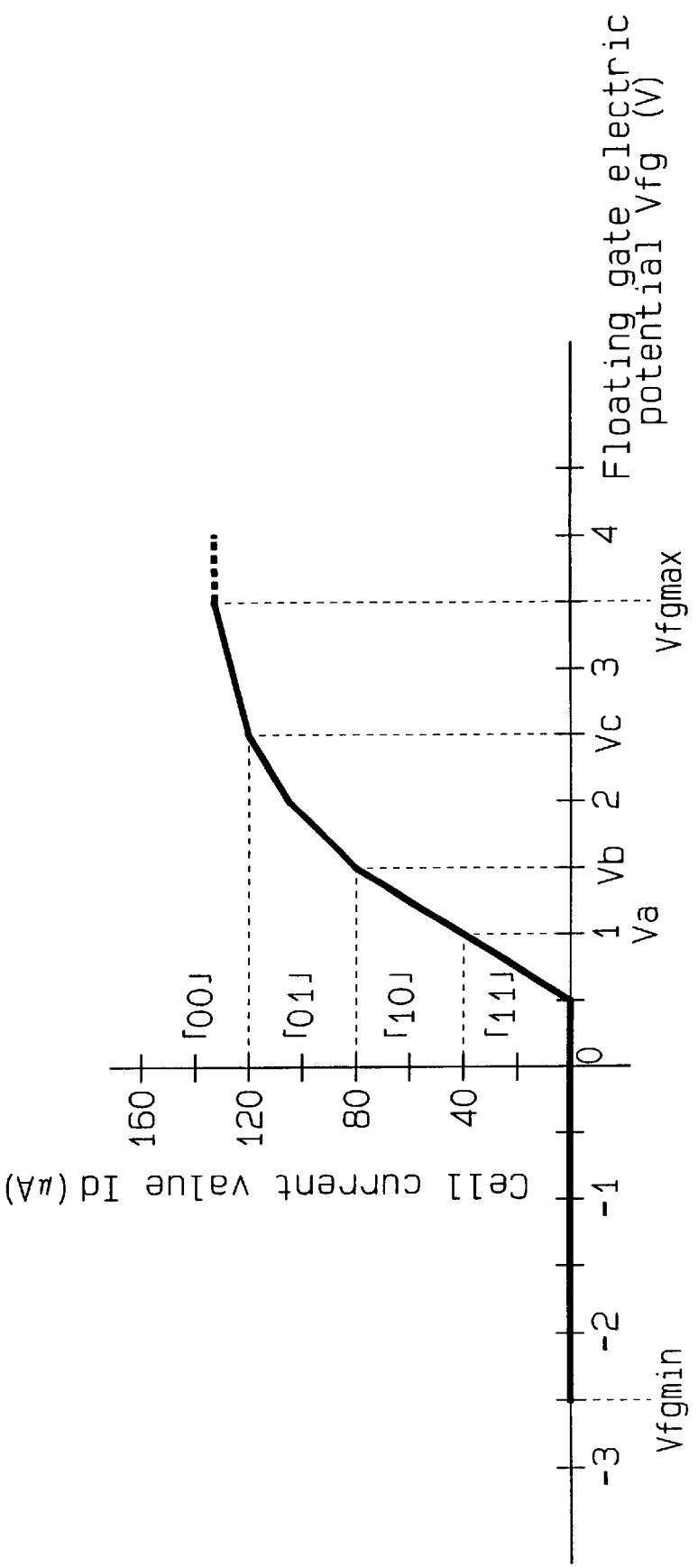
FIG. 1 is a characteristic graph showing the relationship between the cell current that flows in split gate memory cells and the electric potential of a floating gate in each memory cell.

In the above flash EEPROMs, multi-value data can be stored in any memory cell 101 by adjusting the value of the cell current Id which flows in that memory cell. As shown in FIG. 1, The electric potential Vfg of the floating gate FG (hereinafter referred to as "floating gate potential") is the electric potential of the floating gate FG with respect to the electric potential of the source S, and is given by the following equation:

$$Vfg = Vfgw + Vfgc$$

where Vfgw is the electric potential that is produced by charges stored in the floating gate FG in write mode and Vfgc is the potential produced by the capacitive coupling with the drain D. In read mode, the electric potential Vfgc is constant so that the cell current value Id is specifically determined by the electric potential Vfgw. In write mode, the amount of charges in the floating gate FG or the electric potential Vfgw can be controlled by adjusting the write operation time. The control on the floating gate potential Vfg permits the cell current value Id in read mode to be set in an arbitrary value.

Suppose that a data value "11" is associated with the area of the cell current value Id which is less than 40 μA, a data value "10" is associated with the area of the cell current value Id which is equal to or greater than 40 μA and less than 80 μA, a data value "01" is associated with the area of the cell current value Id which is equal to or greater than 80 μA and less than 120 μA, and a data value "00" is associated with the area of the cell current value Id which is equal to or greater than 120 μA. In this case, the write operation time is controlled so that individual floating gate potentials Va, Vb and Vc corresponding to the individual cell current values Id (40 μA, 80 μA and 120 μA) are acquired in write mode. In this manner, four-value (2-bit) data can be stored in a single memory cell.

In read mode, when the floating gate potential Vfg is smaller than the threshold voltage Vth (=+0.5 V) of the transistor which has the floating gate FG, the source S and the drain D, the cell current value Id is 0. When the floating gate potential Vfg exceeds the threshold voltage Vth, the cell current value Id increases upper rightward. When the floating gate potential Vfg exceeds +3.5 V, the cell current value Id is saturated due to the constant resistance of the channel CH which lies directly below the control gate CG. That is, the channel CH serves as a constant resistor because a constant voltage (=+5 V) is applied to the control gate CG. Therefore, a series connection of the transistor to the constant resistor of the channel CH is present in the memory cell. When the floating gate potential Vfg is less than a given value (=+3.5 V), as apparent from the above, the cell current value Id varies in accordance with the characteristic of the transistor.

First Embodiment

A split gate flash EEPROM according to a first embodiment of the invention will now be described with reference to the accompanying drawings. To avoid a redundant description, like or same reference numerals are given to those components of the first embodiment that are like or the same as the corresponding components of the prior art device shown in FIGS. 3 and 4.

Figure 7:
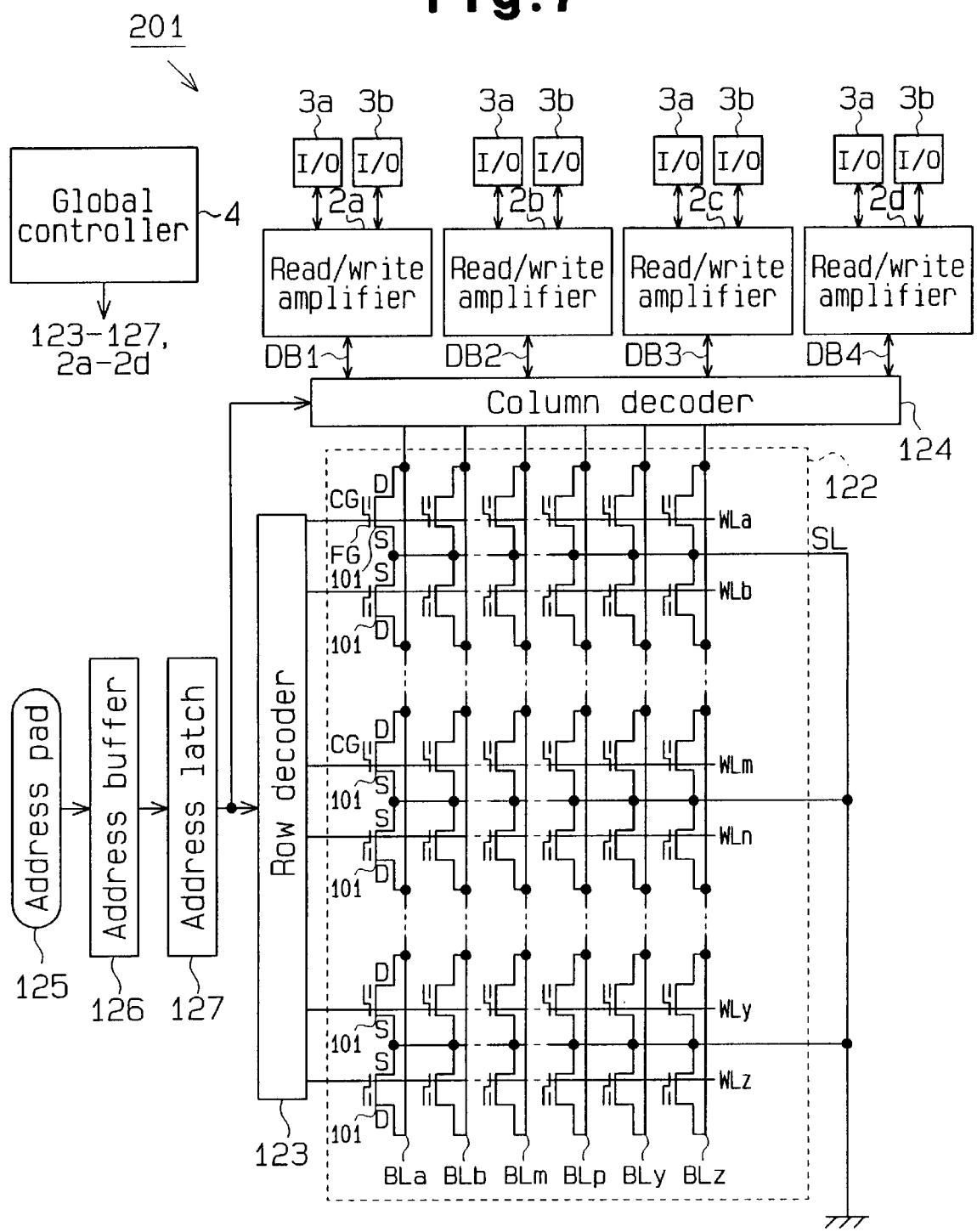
FIG. 7 is a block diagram of a flash EEPROM according to a first embodiment of the invention.

FIG. 7 presents a block diagram showing a flash EEPROM 201 that uses split gate memory cells 101 according to the first embodiment. In the first embodiment, four-value (2-bit) data can be stored in a single memory cell 101. The flash EEPROM 201 according to the first embodiment comprises four read/write amplifiers 2a to 2d, a pair of input/output (I/O) pads 3a and 3b connected to each read/write amplifier and a global controller 4 in addition to the conventional constitution (the memory cell array 122, the row decoder 123, the column decoder 124, the address pad 125, the address buffer 126 and the address latch 127).

The individual read/write amplifiers 2a–2d are connected to the column decoder 124 via data buses DB1 to DB4 respectively. The column decoder 124 selects four bit lines corresponding to the column address and connects the selected four bit lines to the respective data buses DB1–DB4.

In a write mode, the read/write amplifiers 2a–2d receive 1-byte input data supplied from an external unit (not shown) via the associated I/O pads 3a and 3b. Specifically, the read/write amplifier 2a receives the most significant bit of input data via the associated I/O pad 3a and receives the second bit of input data via the associated I/O pad 3b. The read/write amplifier 2b receives the third bit of input data via the associated I/O pad 3a and receives the fourth bit of input data via the associated I/O pad 3b.

The column decoder 124 receives 1-byte input data from each of the read/write amplifiers 2a–2d and transfers the input data onto the selected four bit lines, in a two bit by two bit manner, via the respective data buses DB1–DB4. In this manner, the 1-byte input data is written, in a two bit by two bit manner, in four memory cells 101, which are associated with the selected one word line and the selected four bit lines.

In a read mode, 1-byte read data read from the selected four memory cells 101 is transferred to the read/write amplifiers 2a–2d, in a two bit by two bit manner, via the selected four bit lines, the column decoder 124 and the respective data buses DB1–DB4. Each read/write amplifier supplies the read data in a bit by bit manner to the associated I/O pads 3a and 3b.

The global controller 4 controls the operations of the read/write amplifiers 2a–2d, the row decoder 123, the column decoder 124, the address pad 125, the address buffer 126 and the address latch 127.

Figure 8:
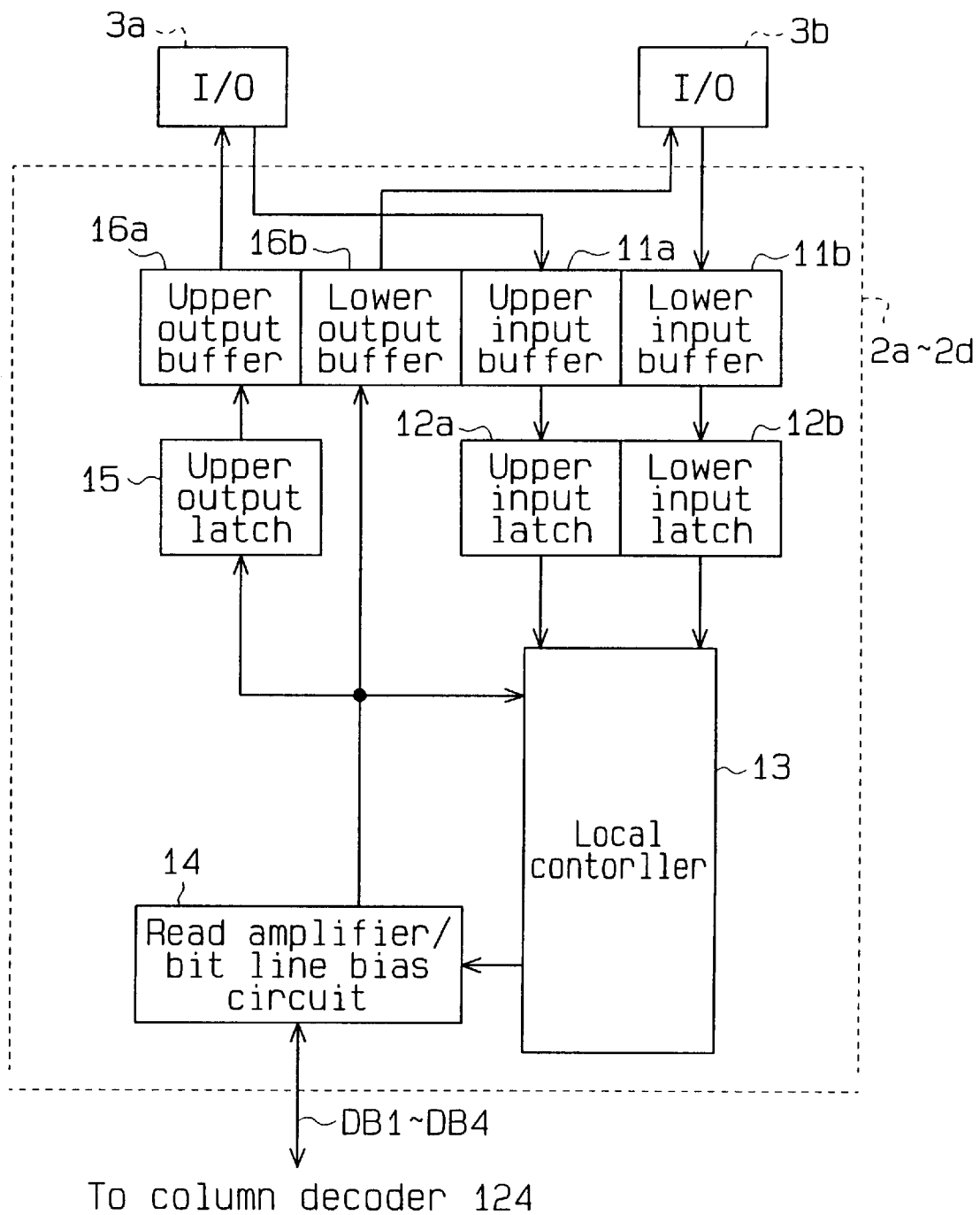
FIG. 8 is a block diagram showing a read/write amplifier in the flash EEPROM in FIG. 7.

As shown in FIG. 8, each of the read/write amplifiers 2a–2d includes an upper input buffer 11a, a lower input buffer 11b, an upper input latch 12a, a lower input latch 12b, a local controller 13, a read amplifier/bit line bias circuit 14, an upper output latch 15, an upper output buffer 16a and a lower output buffer 16b.

In the write mode, the upper input buffer 11a receives the upper one bit of input data supplied to the I/O pad 3a, and transfers that data to the upper input latch 12a. The lower input buffer 11b receives the lower one bit of input data supplied to the I/O pad 3b and transfers that data to the lower input latch 12b. The input latches 12a and 12b transfer the latched input data to the local controller 13.

In the read mode, the read amplifier/bit line bias circuit 14 receives read data, which is read from the selected memory cells 101, via the selected bit lines, the column decoder 124 and the data buses DB1–DB4.

The local controller 13 controls the operation of the read amplifier/bit line bias circuit 14 in accordance with the upper one bit of read data or the input data. (This control will be discussed later.)

The read amplifier/bit line bias circuit 14 controls the voltage to be applied to the selected bit lines in the write mode and determines the data value of the upper and lower one bits of read data in the read mode. The read amplifier/bit line bias circuit 14 supplies the determined upper one bit of read data to the upper output latch 15 and the local controller 13. The latched upper one bit of read data is transferred via the upper output buffer 16a to the I/O pad 3a. Further, the read amplifier/bit line bias circuit 14 sends the determined lower one bit of read data to the I/O pad 3b via the lower output buffer 16b. The latched lower one bit read data is transferred to the I/O pad 3b via the lower output buffer 16b.

Figure 9:
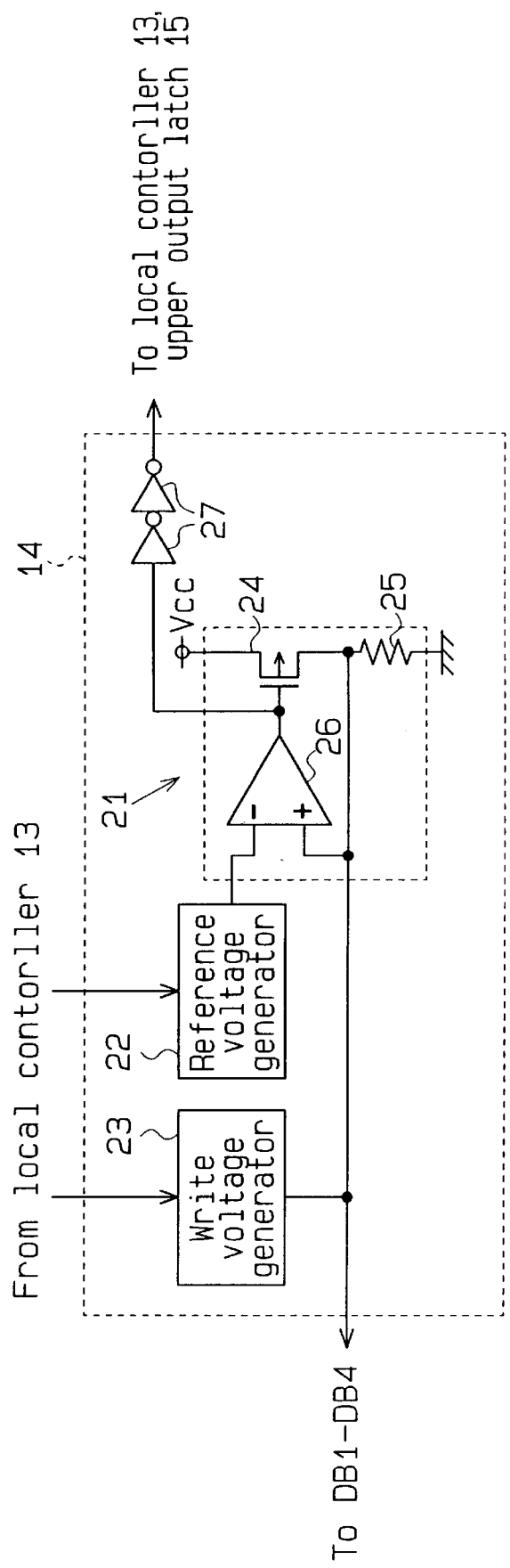
FIG. 9 is a block diagram depicting a read amplifier/bit line bias circuit in the read/write amplifier in the flash EEPROM in FIG. 8.

FIG. 9 is a block diagram depicting the read amplifier/bit line bias circuit 14. The read amplifier/bit line bias circuit 14 includes a current sense amplifier 21, a reference voltage generator 22, a write voltage generator 23 and two inverters 27. The current sense amplifier 21 includes a PMOS transistor 24, a feedback resistor 25 and an operational amplifier 26.

The reference voltage generator 22 selectively generates individual reference voltages (+4 V, +3.25 V, +2.5 V, +1.75 V and +1 V) in the reading operation under the control of the local controller 13. The write voltage generator 23 generates a write voltage (+12 V) and applies that write voltage to one associated data bus in the writing operation under the control of the local controller 13.

The PMOS transistor 24 in the current sense amplifier 21 has a source to which the internal supply voltage $V_{cc}$ of the flash EEPROM 201 is applied, a drain grounded via the feedback resistor 25, and a gate connected to the output terminal of the operational amplifier 26. The operational amplifier has an inverting input terminal to which each reference voltage generated by the reference voltage generator 22 is applied and a non-inverting input terminal connected to one associated data bus. The output terminal of the operational amplifier 26 is also connected to the upper output latch 15 and the local controller 13 via the two series-connected inverters 27.

Therefore, negative feedback is applied to the operational amplifier 26 via the PMOS transistor 24 and the feedback resistor 25. When the voltage level of the non-inverting input terminal drops, for example, the voltage level of the output terminal or the gate voltage of the PMOS transistor 24 falls and the drain voltage rises. As a result, the voltage level of the non-inverting input terminal increases. This current sense amplifier 21 is widely used as a sense amplifier for semiconductor memory devices, and its similar circuit is disclosed in, for example, IEEE Journal of Solid-State Circuit, vol. 26, No. 4, April 1991, pp. 465–471 by Yoshinobu Nakagome et al.

The read amplifier/bit line bias circuit 14 performs the following operations.

(1) In the writing operation, the write voltage generator 23 applies voltages corresponding to data to be written to the associated data buses.

(2) In the reading operation, the current sense amplifier 21 operates to make the voltages on the data buses equal to the individual reference voltages. Therefore, the read amplifier/bit line bias circuit 14 operates to set the voltages applied to the bit lines, which are connected via the column decoder 124 to the associated data buses, equal to the reference voltages generated by the reference voltage generator 22.

Subsequently, the current sense amplifier 21 outputs a signal having a voltage level corresponding to the current that flows on the associated data bus from the output terminal of the operational amplifier 26. The voltage level of the output signal of the current sense amplifier 21 is settled to a high (H) level or a low (L) level by the inverting actions of the individual inverters 27. When the current is flowing on a data bus, for example, a signal having an L level is output from the last stage of the inverters 27. When no current is flowing on a data bus, a signal having an H level is output from the last stage of the inverters 27. In accordance with the presence or absence of the current, or the cell current, that flows on a data bus, the read amplifier/bit line bias circuit 14 determines the data value of read data read on the bit line associated with that data bus. For example, a data value 0, or an L-level signal, is determined for the cell current of over zero ampere, and a data value "1," or an H-level signal, is determined for the cell current of zero ampere.

Figure 10:
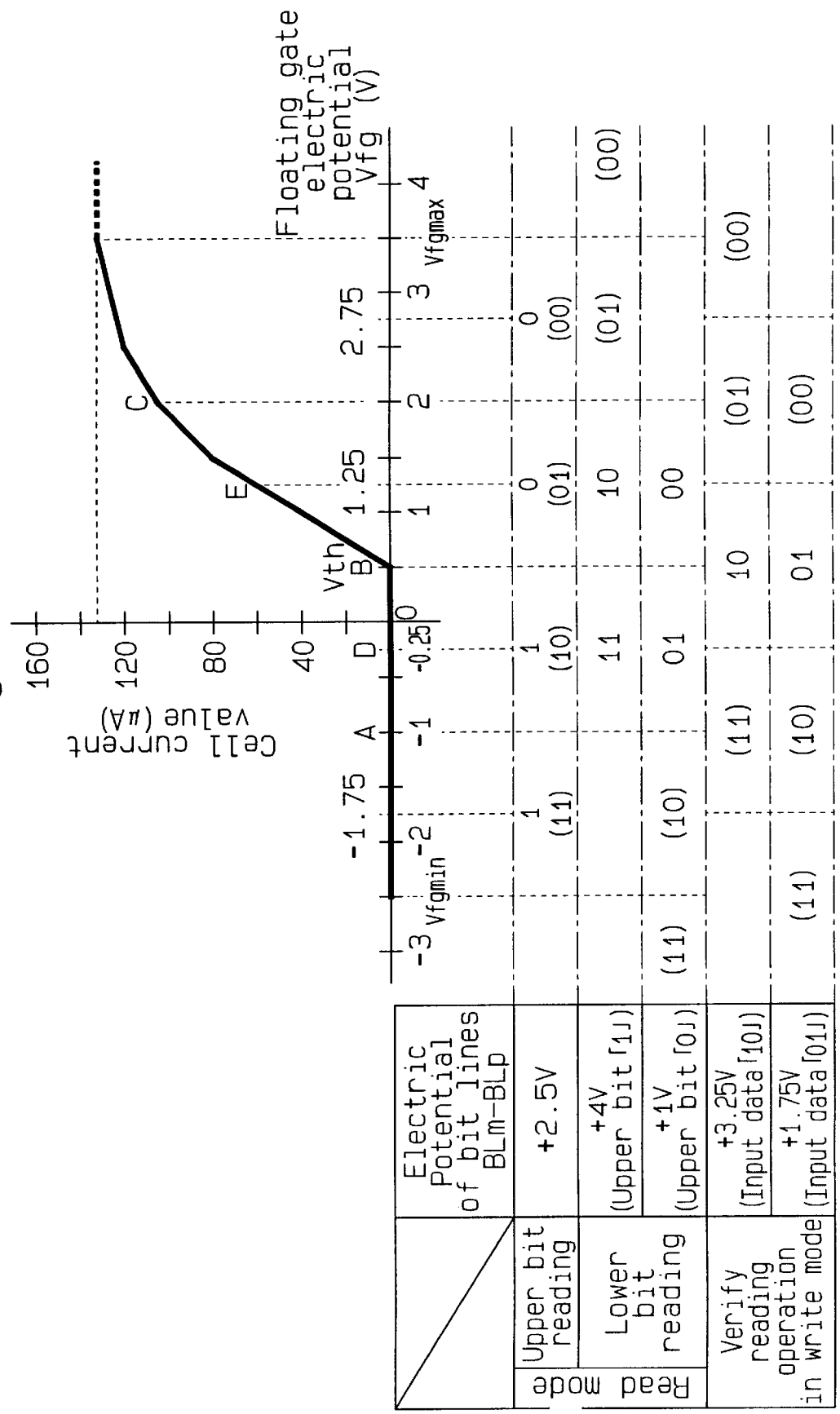
FIG. 10 is a diagram for explaining the individual operational modes of the flash EEPROM according to the first embodiment based on the characteristic graph that shows the relationship between the cell current and the electric potential of the floating gate.

FIG. 10 is a diagram including a characteristic graph showing the relationship between the cell current and the electric potential of the floating gate, based on which the individual operational modes of the flash EEPROM according to the first embodiment will be described. The relationship between the electric potential Vfg of the floating gate FG and the cell current value Id is the same as that shown in FIG. 1.

FIG. 10 illustrates the correlation among voltages applied to selected four bit lines (e.g., BLm–BLp), read data and input data, the floating gate potential Vfg and the cell current value Id in the individual operational modes. The range of the floating gate potential Vfg of less than −1 V corresponds to a data value "11". The range of the floating gate potential Vfg of equal to or greater than −1 V and less than +0.5 V corresponds to a data value "10". The range of the floating gate potential Vfg of equal to or greater than +0.5 V and less than +2 V corresponds to a data value "01". The range of the floating gate potential Vfg of equal to or greater than +2 V corresponds to a data value "00".

Read Mode

Figure 11:
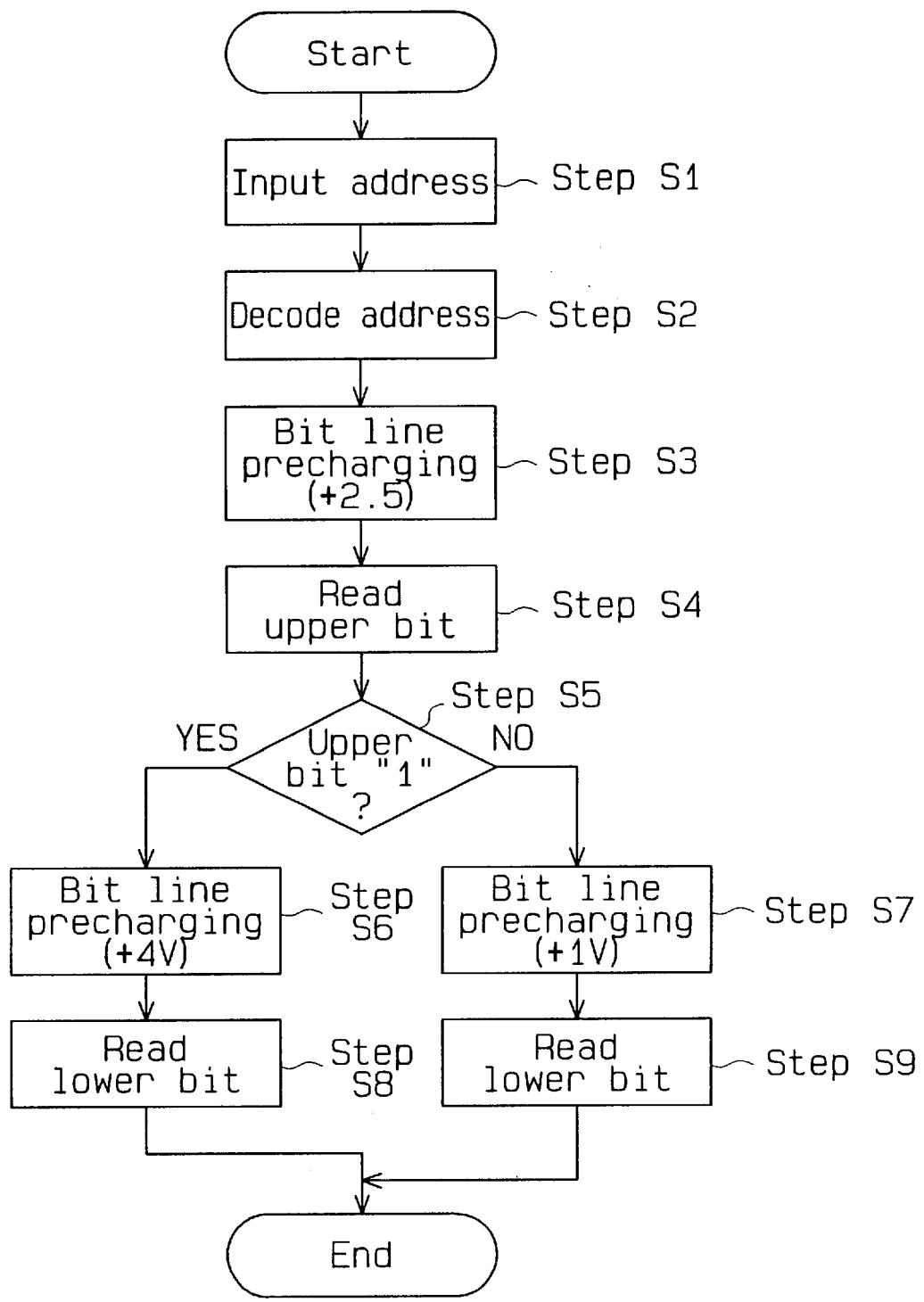
FIG. 11 is a flowchart illustrating the operation of the flash EEPROM according to the first embodiment in a read mode.

The operation in the read mode will now be discussed with reference to the flowchart in FIG. 11. In step S1, the address buffer 126 receives a row address and a column address via the address pad 125 and transfers those addresses to the address latch 127. In step S2, the row decoder 123 receives the row address latched by the address latch 127 and applies +5 V to one word line WLm selected according to the row address. The voltage of the ground level is applied to the other word lines WLa–WLl and WLn–WLz. The column decoder 124 receives the column address latched by the address latch 127 and connects four bit lines BLm–BLp selected according to the column address to the respective four data buses DB1–DB4.

In step S3, precharging of bit lines is executed. The reference voltage generator 22 generates a voltage of +2.5 V under the control of the local controller 13, and the current sense amplifier 21 operates to maintain the voltage on the associated data bus at +2.5 V. As a result, the individual bit lines BLm–BLp connected to the respective data buses DB1–DB4 are precharged to +2.5 V.

In step S4, the upper one bit of data is read from each of the selected four memory cells 101. Each read amplifier/bit line bias circuit 14 determines the read data value of the upper one bit as "0" when the value Id of the cell current flowing on the associated one of the data buses DB1–DB4 exceeds zero. The circuit 14 determines the read data value of the upper one bit as "1" when the value Id of the cell current flowing on the associated data bus is zero. In other words, the data value of the upper one bit is determined to be "1" when the floating gate potential Vfg is less than the threshold voltage Vth (+0.5 V) of the memory cell 101. The data value of the upper one bit is determined to be "0" when the floating gate potential Vfg is equal to or greater than the threshold voltage Vth. The upper one bit of read data is transferred to the upper output latch 15 and the local controller 13. The upper output latch 15 latches the read data and transfers it to the I/O pad 3a via the upper output buffer 16a.

In step S5, the local controller 13 identifies the data value of the upper one bit and then controls the reference voltage generator 22 so as to read the lower one bit of data. That is, the flow proceeds to step S6 when the data value is "1" and the flow proceeds to step S7 when the data value is "0". The individual read/write amplifiers associated with the respective data buses DB1–DB4 perform the above operation independently.

In step S6, bit line precharging is executed. The reference voltage generator 22 generates a voltage of +4 V under the control of the local controller 13. The current sense amplifier 21 operates to maintain the voltage on the associated data bus at +4 V. As a result, one or more bit lines, which are connected to those of the data buses DB1–DB4 associated with the upper bit of "1", are precharged to +4 V. This precharging permits the floating gate potential Vfg to be pulled up by +1.5 V (=+4 V−2.5 V) due to the capacitive coupling of the floating gate FG and the drain D connected to the associated precharged bit line. Consequently, the Vfg-Id characteristic curve shown in FIG. 10 is shifted substantially in the positive direction by the increase of the floating gate potential Vfg.

In step S8, the lower one bit of data is read from one memory cell, which is associated with the upper bit of "1", among four selected memory cells 101. Each read amplifier/bit line bias circuit 14 determines the data value of the lower one bit of read data in accordance with the presence or absence of the cell current value Id, which flows on the data buses DB1–DB4, as done in step S4. At this time, the electric potential of the floating gate FG has been pulled up by +1.5 V. Therefore, the range of the floating gate potential corresponding to the cell current of zero ampere is shifted in the positive direction by +1.5 V. The range is equal to or less than the threshold voltage Vth (+0.5 V) of the memory cells 101. Consequently, a point A on the Vfg-Id characteristic curve where the floating gate potential Vfg is −1 V is shifted to (or matched with) a point B of the threshold voltage Vth.

When the cell current value Id is zero, therefore, the lower bit is determined as "1", and multivalue data "11" is read out. The multivalue data "11" corresponds to the range of the floating gate potential Vfg that is less than −1 V. When the cell current value Id exceeds zero, the lower bit is determined as "0", and multivalue data "10" is read out. The multivalue data "10" corresponds to the range of the floating gate potential Vfg that is equal to or greater than −1 V and less than +0.5 V. In this manner, the low range and high range of the floating gate potential Vfg are distinguished from each other based on the point A matched with the point B. The read mode is then terminated.

In step S7, bit line precharging is executed. The reference voltage generator 22 generates a voltage of +1 V under the control of the local controller 13. The current sense amplifier 21 operates to hold the voltage on the associated data bus at +1 V. As a result, one or more bit lines, which are connected to those of the data buses DB1–DB4 for which the upper bit has been determined as "10", are precharged to +1 V. This precharging permits the floating gate potential Vfg to be pulled up by +1.5 V (=+2.5 V−1 V) due to the capacitive coupling of the floating gate FG and the drain D. Consequently, the Vfg-Id characteristic curve shown in FIG. 10 is shifted substantially in the negative direction by the drop of the floating gate potential Vfg.

In step S9, the data value of the lower one bit of read data is determined in accordance with the presence or absence of the cell current value Id, which flows on those of the data buses DB1–DB4 associated with the upper bit of "0". The lower one bit of data is read from those of the selected four memory cells 101 that are associated with the upper bit of "0". At this time, the electric potential of the floating gate FG has been pulled down by +1.5 V. As shown in FIG. 10, therefore, the range of the floating gate potential corresponding to the increased cell current value Id is shifted in the negative direction by +1.5 V. The range of the floating gate potential is equal to or greater than the threshold voltage Vth (+0.5 V) and equal to or less than +3.5 V. Consequently, a point C on the Vfg-Id characteristic curve where the floating gate potential Vfg is +2 V is shifted to (or matched with) the point B of the threshold voltage Vth.

When the cell current value Id is zero, therefore, the lower bit is determined as "1", and multivalue data "01" is read out. The multivalue data "01" corresponds to the range of the floating gate potential Vfg that is equal to or greater than +0.5 V and less than +2 V When the cell current value Id exceeds zero, the lower bit is determined to be "0", and multivalue data "00" is read out. The multivalue data "00" corresponds to the range of the floating gate potential Vfg that is equal to or greater than +2 V. In this manner, the low range and high range of the floating gate potential Vfg are distinguished from each other based on the point C matched with the point B. The read mode is then terminated. Steps S6 and S7 in FIG. 11 may be executed synchronously. Likewise, steps S8 and S9 may be executed synchronously.

Write Mode

The operation in the write mode will now be discussed with reference to the flowchart in FIG. 12. Before entering the write mode, the mode is set to the erase mode to erase data in all the memory cells 101 in the memory cell array 122. In this case, block erasure may be carried out to erase only that block that contains the memory cells 101 where data is to be written. As electrons have been drained out from the floating gate FG in any erased memory cell, the data value "00" is stored in that memory cell.

In the write mode, step S21, which is the same as step S1, and step S22, which is the same as step S2, are performed. In step S22, the row decoder 123 applies +1 V to one word line WLm selected according to the row address and applies the voltage of the ground level to the non-selected word liens WLa–WLl and WLn–WLz.

In step S23, the upper one bit of input data supplied to each I/O pad 3a is transferred to the local controller 13 via the upper input buffer 11a and the upper input latch 12a in the associated read/write amplifier. The lower one bit of input data supplied to each I/O pad 3b is transferred to the local controller 13 via the lower input buffer 11b and the lower input latch 12b in the associated read/write amplifier.

In step S24, the local controller 13 determines if the input data value is "00" and controls the reference voltage generator 22 in the associated read amplifier/bit line bias circuit 14 based on the determination result. The flow proceeds to step S25 when the data value is not "00". The write mode is terminated when the data value is "00", in which case the writing operation is unnecessary. That is, when the input data value is "00", no writing operation is performed.

In step S25, the local controller 13 determines if the input data value is "10". The flow proceeds to step S26 when the data value is "10". The flow proceeds to step S27 when the data value is not "10".

In step S26, writing of the data value "10" is performed. In step S28, +3.25 V is applied to those of the bit lines BLm–BLp which are associated with the input data "10" to execute a verify read operation. The writing operation and verify read operation are repeated until the cell current value Id becomes zero in step S29.

This will be discussed more specifically. In step S26, the write voltage generator 23 applies +12 V to the associated data bus under the control of the local controller 13. As a result, the bit lines connected to those of the data buses DB1–DB4 associated with the input data "10" are precharged to +12 V. Consequently, the electric potential Vfg of the floating gate FG is pulled up so that hot electrons are injected into the floating gate FG. In order to write the data value "10" in the associated memory cells 101, this writing operation is executed for a given time (several hundred nanoseconds to several microseconds) so that the floating gate potential Vfg becomes equal to or greater than −1 V and less than +0.5 V. In other words, the writing operation is stopped when the floating gate potential Vfg becomes equal to or greater than −1 V and less than +0.5 V. The Vfg-Id characteristic varies due to a structural variation of the individual memory cells. This variation of the Vfg-Id characteristic takes the form of normal distribution. To accurately write the data value "10" in the memory cells whose characteristics vary, therefore, it is preferable that the writing operation be stopped when the floating gate potential Vfg becomes −0.25 V or the middle value between −1 V and +0.5 V.

In step S28, bit line precharging is executed. This bit line precharging is performed for the verify reading operation. Verify reading operation determines if the data value "10" has been written in the memory cells in accordance with the presence or absence of the cell current by pulling up the floating gate potential Vfg. The reference voltage generator 22 generates a voltage of +3.25 V under the control of the local controller 13. The current sense amplifier 21 operates to hold the voltage on the associated data bus at +3.25 V. As a result, one or more bit lines, which are connected to those of the data buses DB1–DB4 for which the input data has been determined as "10", are precharged to +3.25 V. This precharge voltage (+3.25 V) is set to the middle value between the precharge voltage (+4 V) in step S6 and the precharge voltage (+2.5 V) in step S3 both in the read mode.

When +3.25 V is applied to the bit lines BLm–BLp, the electric potential of the floating gate FG is pulled up by +0.75 V (=+3.25 V–2.5 V). Consequently, the range of the floating gate potential Vfg, which corresponds to the cell current of zero ampere, is shifted in the positive direction by +0.75 V, as shown in FIG. 10. As a result, the point A, where the floating gate potential Vfg is –1 V, is shifted to a point D of –0.25 V. The point B of the threshold voltage Vth is shifted to a point E of +1.25 V. The point D of –0.25 V is shifted to the point B.

In step S29, in the four memory cells 101 associated with the selected word line and bit lines, write data is read from one or more memory cells associated with the input data "10" for verification. In step S30, each read amplifier/bit line bias circuit 14 determines whether or not the cell current value Id exists for the associated memory cells 101. Through this determination, it is determined if the floating gate potential Vfg lies at the intermediate point D (–0.25 V) between the point A (–1 V) and the point B (+0.5 V) and if the data value "10" has been written. When the cell current value Id is zero, it is determined that the floating gate potential Vfg lies at the intermediate point D and the data value "10" has been written in the memory cells 101 so that the write mode will then be terminated. When the cell current value Id is not zero, steps S26 and S28–S30 are repeated until the cell current value Id becomes zero, after which the write mode will be terminated.

In step S27, the local controller 13 determines if the input data value is "01". The flow proceeds to step S31 when the data value is "01". The flow proceeds to step S32 when the data value is not "01", i.e., when the data value is "11".

In step S31, writing of the data value "01" is performed. In step S33, +1.75 V is applied to one or more the bit lines BLm–BLp associated with the input data "01" to execute a verify read operation. The writing operation and verify read operation are repeated until the cell current value Id becomes zero in step S35.

This will be discussed more specifically. In step S31, the writing operation of applying +12 V to the associated data buses is performed. This writing operation is stopped when charges are stored in the floating gate to write the data value "01" in the associated memory cell 101 so that the floating gate potential Vfg becomes equal to or greater than +0.5 V and less than +2 V. Electrons have been drained from the floating gate FG in any erased memory cell 101, and that floating gate has an electric potential of +2 V or higher.

To accurately write the data value "01" in the memory cells whose Vfg-Id characteristics vary, it is preferable that the writing operation be stopped when the floating gate potential Vfg becomes +1.25 V, which is the middle value between +0.5 V and +2.0 V.

In step S33, bit line precharging is executed. This bit line precharging is performed for the verify reading operation. The verify reading operation determines if the data value "01" has been written in the memory cells in accordance with the presence or absence of the cell current by pulling down the floating gate potential Vfg. The reference voltage generator 22 generates a voltage of +1.75 V under the control of the local controller 13. The current sense amplifier 21 operates to maintain the voltage on the associated data bus at +1.75 V. As a result, one or more the bit lines, which are connected to those of the data buses DB1–DB4 associated with the input data "01", are precharged to +1.75 V.

This precharge voltage (+1.75 V) is set to the middle value between the precharge voltage (+2.5 V) in step S3 and the precharge voltage (+1 V) in step S7, both in the read mode.

When +1.75 V is applied to those of the bit lines BLm––BLp associated with the input data "01", the electric potential of the floating gate FG is pulled down by +0.75 V (=+2.5 V–1.75 V). Consequently, the range of the floating gate potential Vfg corresponding to the cell current value Id representing an increment is shifted in the negative direction by –0.75 V, as shown in FIG. 10. As a result, the point B of the threshold voltage Vth is shifted to the point D of –0.25 V, the point C of +2 V is shifted to the point E of +1.25 V and the point E of +1.25 V is shifted to the point B.

In step S34, as in step S29, write data is read from those of the four memory cells 101 associated with the input data "01" for verification. In the next step S35, each read amplifier/bit line bias circuit 14 determines whether or not the cell current value Id exists for the associated memory cells 101. Through this determination, it is determined if the floating gate potential Vfg lies at the intermediate point E (+1.25 V) between the point B (+0.5 V) and the point C (+2.0 V) and if the data value "01" has been written. When the cell current value Id is zero, it is determined that the floating gate potential Vfg lies at the intermediate point E and the data value "01" has been written in the memory cells 101. The write mode will then be terminated. When the cell current value Id is not zero, steps S31 and S33–S35 are repeated until the cell current value Id becomes zero, after which the write mode will be terminated.

In step S32, as in step S26, writing of the data value "11" in the memory cells 101 is carried out, after which the write mode will be terminated. The time for this writing operation is set long enough for the data value "11" to be written in the memory cells 101. That is, the writing operation is stopped when the floating gate potential Vfg becomes less than –1 V. In view of a variation in the Vfg-Id characteristic curves of the individual memory cells, however, it is preferable that the writing operation be stopped when the floating gate potential Vfg reaches a level sufficiently lower than –1 V. The writing time in step S32 therefore should be set to the optimal time based on the results of experiments on the writing operation in consideration of a variation in the Vfg-Id characteristic curves. In this embodiment, no verify reading operation is performed for the input data value "11".

Figure 12:
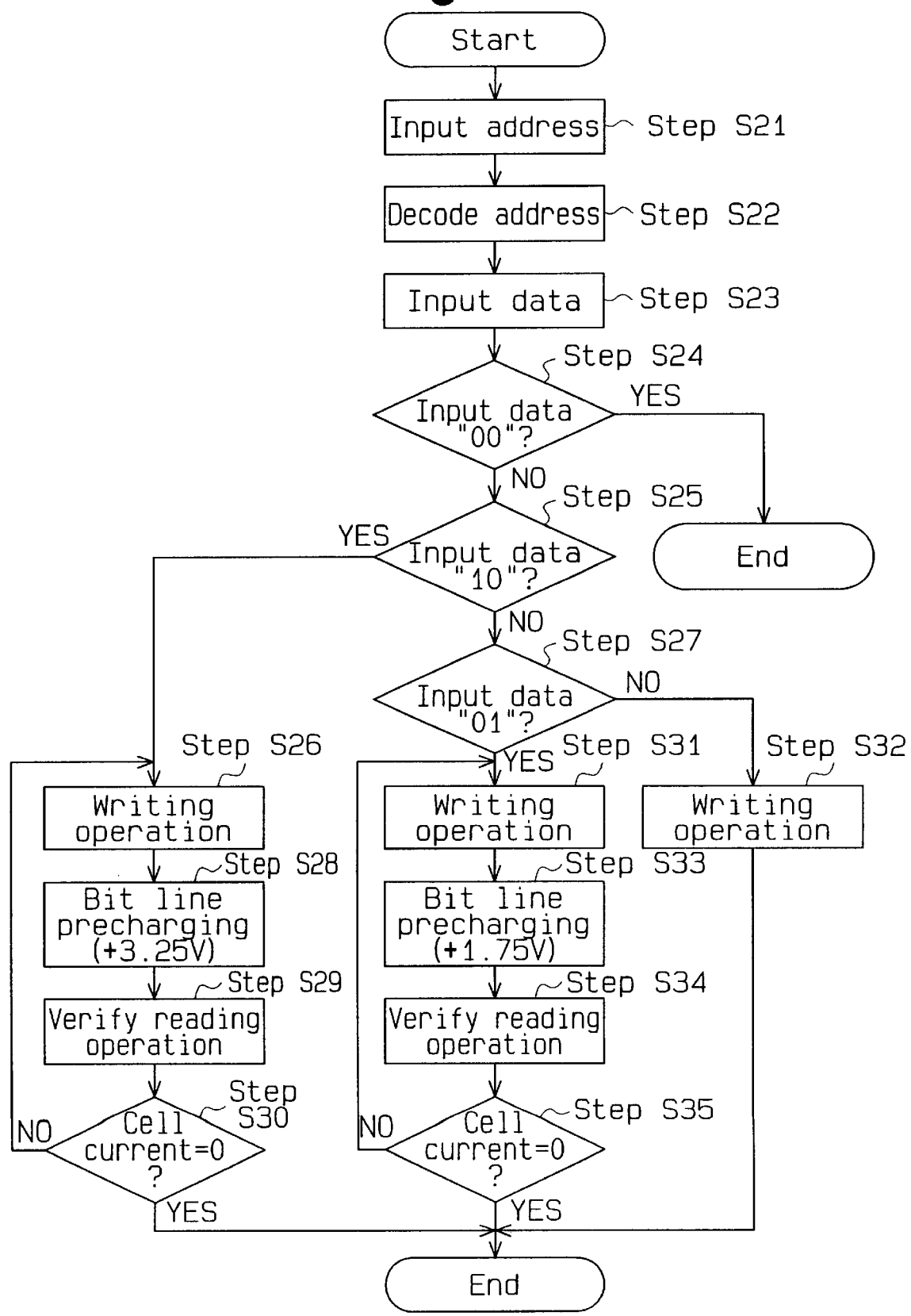
FIG. 12 is a flowchart illustrating the operation of the flash EEPROM according to the first embodiment in a write mode.

Steps S12, S31 and S32 in FIG. 12 may be executed synchronously. Further, steps S28 and S33 may be executed synchronously. In this case, the individual data buses DB1–DB4 and the individual bit lines BLm–BLp connected thereto are precharged to the voltage corresponding to the associated input data. Furthermore, steps S29 and S34 may be executed synchronously. Likewise, steps S30 and S35 may be performed synchronously. This synchronization of the individual stages in the writing operation allows data to be simultaneously written in four memory cells. This contributes to speed-up of the writing operation.

As apparent from the above, this first embodiment permits multivalue data to be written even using the range where the cell current value Id does not change (the range where the floating gate potential Vfg is equal to or less than the threshold voltage Vth). This can expand the range of the floating gate potential Vfg for each data value (by 1.5 V). It is therefore possible to ensure a sufficient margin for precisely setting the floating gate potential Vfg in the writing operation. This surely prevents writing errors.

At the time the lower one bit of data is read in the read mode, the floating gate potential Vfg is increased or decreased in accordance with the data value of the upper one bit. This permits the Vfg-Id characteristic curve to be shifted in the positive direction or the negative direction so that the boundary electric potential for the decision of whether the data value of the lower one bit is "0" or "1" is shifted to the threshold voltage Vth (point B). That is, the floating gate potential Vfg is permitted to be shifted near the threshold voltage Vth. In this manner, the data value of the lower one bit can be discriminated by determining the presence or absence of the cell current value Id.

At the time verify reading is performed in the write mode, the floating gate potential Vfg is increased or decreased in accordance with the input data value. This permits the Vfg-Id characteristic curve to be shifted in the positive direction or the negative direction so that the intermediate value in the range of the floating gate potential Vfg corresponding to the input data value can be shifted to the threshold voltage Vth (point B). That is, the floating gate potential Vfg is permitted to be shifted near the threshold voltage Vth. In this manner, the read data value can be discriminated by determining the presence or absence of the cell current value Id.

The ranges of the cell current value corresponding to the data values "1" and "0" are wide in the reading operation and the verify reading operation for the upper and lower bits. Therefore, it is possible to achieve a sufficient margin for accurately reading the cell current value Id. This reliably prevents a writing error.

The read amplifier/bit line bias circuit 14 detects the presence or absence of the cell current value Id in order to discriminate the data value of each bit. The operation of the circuit 14 is easier than the operation in the conventional flash EEPROM for detecting in which range the cell current value Id lies. Since the read amplifier/bit line bias circuit 14 merely detects the presence or absence of the cell current value Id, precision of detection of read data may be low compared to that required by the mode of the prior art. This feature facilitates the design of the read amplifier/bit line bias circuit 14, thus ensuring a simpler circuit structure and reducing the chip area and consumed power.

Second Embodiment

Figure 13:
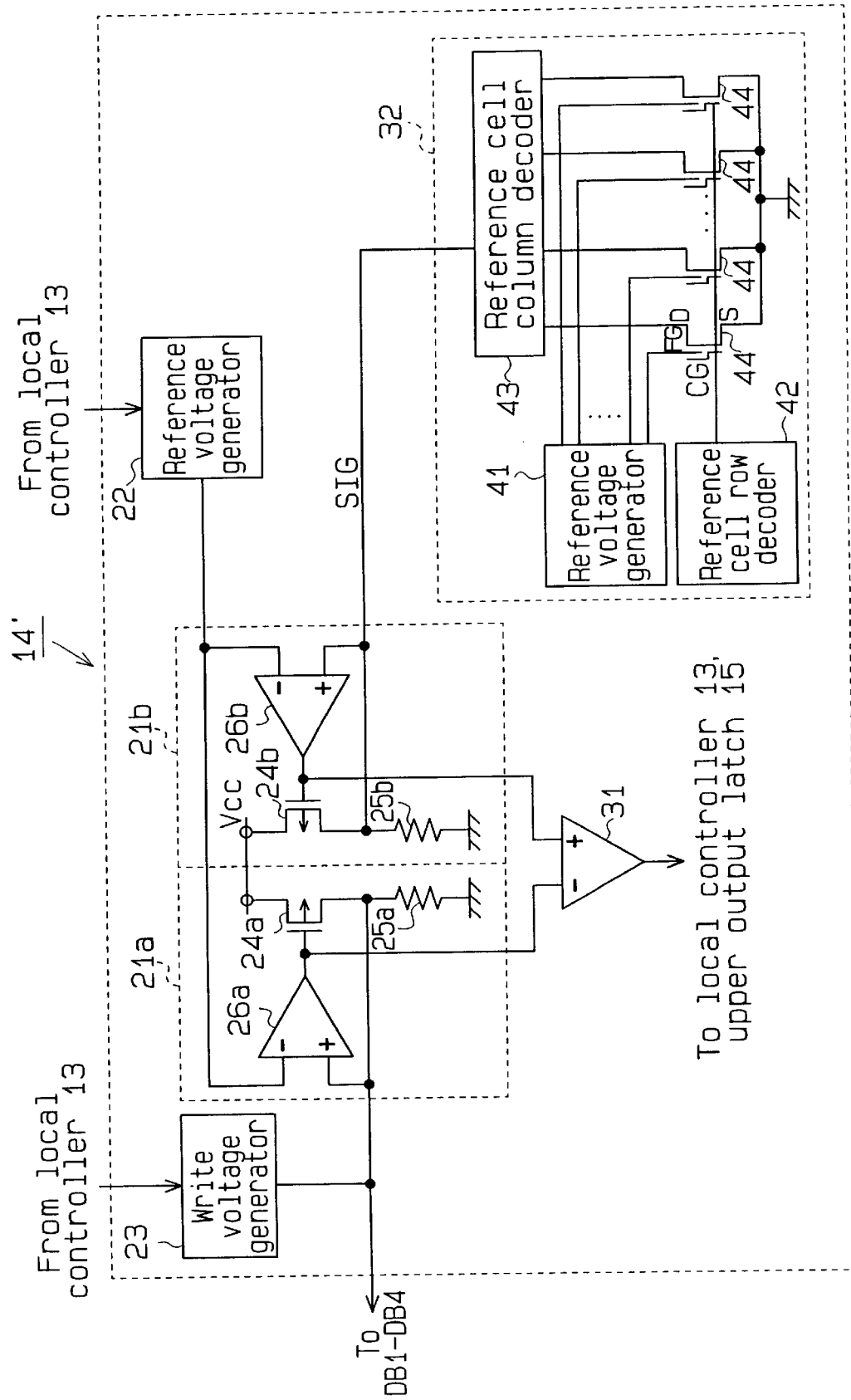
FIG. 13 is a block diagram depicting a read amplifier/bit line bias circuit in a flash EEPROM according to a second embodiment of the invention.

A split gate flash EEPROM according to a second embodiment of this invention will now be described with reference to the accompanying drawings. The second embodiment differs from the first embodiment in the structure of the read amplifier/bit line bias circuit 14. As shown in FIG. 13, a read amplifier/bit line bias circuit 14' includes first and second current sense amplifiers 21a and 21b, the reference voltage generator 22, the write voltage generator 23, a comparator 31 and a reference cell block circuit 32.

A reference voltage is applied to the inverting input terminal of an operational amplifier 26a in the first current sense amplifier 21a. The non-inverting input terminal of the operational amplifier 26a is connected to an associated data bus.

The reference voltage is applied to the inverting input terminal of an operational amplifier 26b in the second current sense amplifier 21b. The non-inverting input terminal of the operational amplifier 26b is connected to the reference cell block circuit 32 via a signal line SIG.

The comparator 31 has an inverting input terminal connected to the output terminal of the operational amplifier 26a, a non-inverting input terminal connected to the output terminal of the operational amplifier 26b and an output terminal connected to the upper output latch 15 and the local controller 13.

The reference cell block circuit 32 includes a reference voltage generator 41, a reference cell row decoder 42, a reference cell column decoder 43 and a plurality of reference cells 44. The reference cells 44 are formed in the same size as the memory cells 101 in the memory cell array 122. The sources S of all the reference cells 44 are grounded.

In the read mode and the verify reading operation in the write mode, the reference voltage generator 41 generates a plurality of different reference voltages and applies those reference voltages to the floating gates FG of the reference cells 44. The reference cell row decoder 42 operates synchronously with the row decoder 123 to control the voltages to be applied to the control gates CG of all the reference cells 44 at the same time the row decoder 123 selects one of the word liens WLa–WLz. The reference cell column decoder 42 operates synchronously with the column decoder 124 to select one of the reference cells 44 and connect the drain D of the selected cell 44 to the signal line SIG in the read mode or the write mode.

The read amplifier/bit line bias circuit 14' in the second embodiment compares the level of the cell current flowing in the selected memory cell 101 with the level of the current flowing on the signal line SIG to determine the level of the cell current or the read data value. For example, the read data value is determined to be "0" when the amount of the cell current is greater than the current flowing in the signal line SIG, and it is determined to be "1" when the cell current is smaller than the signal line current.

This will now be discussed more specifically. The first current sense amplifier 21a, like the current sense amplifier 21 in the first embodiment, detects the cell current flowing in the selected memory cell 101 from the associated bit line via the column decoder 124 and the associated data bus.

In the read mode and the verify reading operation in the write mode, individual reference voltages are applied to the floating gates FG of the respective reference cells 44. As a result, the floating gate potential Vfg of each reference cell 44 becomes substantially equal to the associated reference voltage. The second current sense amplifier 21b detects the current that flows on the signal line SIG from each reference cell 44 via the reference cell column decoder 43 and the signal line SIG. The amplifier 21b outputs a signal the voltage level of which corresponds to the detected current from the output terminal of the operational amplifier 26.

The comparator 31 subtracts the output signal of the first current sense amplifier 21a from the output signal of the second current sense amplifier 21b and sends out a signal the voltage level of which corresponds to the subtraction result from the output terminal. For example, the comparator 31 outputs a signal indicating the read data value "0" and having an L level when more current flows on the associated data bus than the current flowing on the signal line SIG. The comparator 31 outputs a signal indicating the read data value "1" and having an H level when less current flows in the associated data bus than in the signal line current.

According to the second embodiment, not only the presence or absence of the cell current but also the read data value of the lower one bit can be discriminated in accordance with the level of the cell current. Further, read data value can be discriminated in accordance with not only the presence or absence of the cell current but also the level of the cell current in the verify reading operation in the write mode.

According to the second embodiment, the range of the floating gate potential Vfg corresponding to the data value "01", for example, is bisected. A data value "011" is associated with the range of the cell current of less than 60 μA or the range of the floating gate potential of less than +1.25 V. A data value "010" is associated with the range of the cell current of equal to or greater than 60 μA or the range of the floating gate potential of equal to or greater than +1.25 V. In this case, the floating gate potential Vfg of each reference cell 44 is set to a value corresponding to the cell current value Id =60 μA in the writing operation. Individual data values can therefore be discriminated by detecting the presence or absence of the cell current value and the level of the cell current after the boundary floating gate potential for discriminating data values is shifted to the threshold voltage Vth (point B) as needed. In other words, data of eight values (3 bits) can be stored in a single memory cell 101. When the range of the cell current value corresponding to each data value is segmented to four subranges, 4-bit data can be associated with each subrange. That is, data of sixteen values (4 bits) can be stored in a single memory cell 101. The number of subranges for each data value is not necessarily be the same as that for the other data values. For example, the data value "11" may not be divided into two, the data value "10" may not be divided into three, the data value "01" may not be divided into four, and the data value "00" may not be divided at all.

Stacked Gate Flash EEPROM

Figure 14:
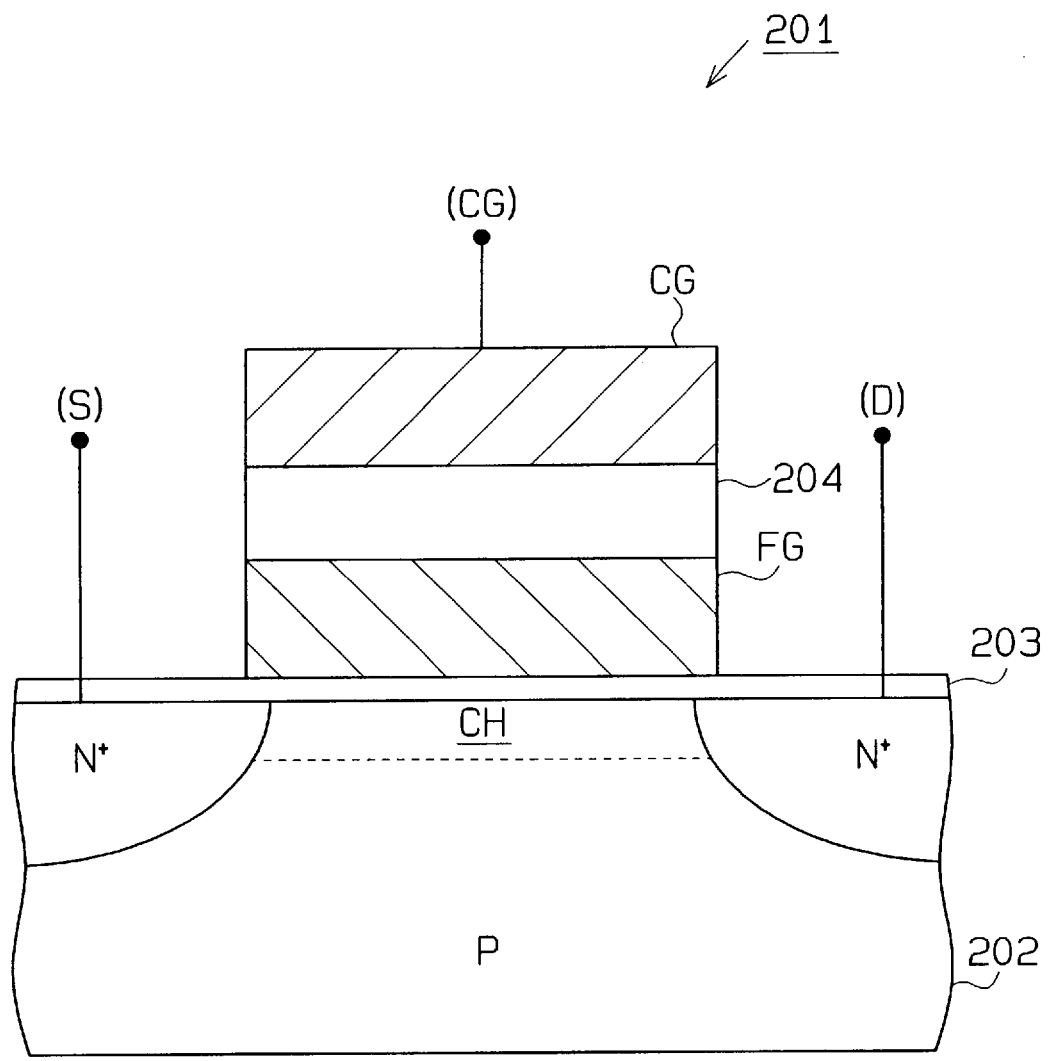
FIG. 14 is a schematic cross-sectional view of a stacked gate memory cell.

FIG. 14 is a schematic cross-sectional view showing a conventional stacked gate memory cell 201. The stacked gate memory cell 201 has a source S and a drain D both having an N-type conductivity and defined on a single crystalline silicon substrate 202 having a P-type conductivity, a floating gate FG located on a first insulator film 203 over a channel CH between the source S and the drain D, and a control gate CG arranged on a second insulator film 204 over the floating gate FG. The floating gate FG and the control gate CG are stacked, the former on the latter, without deviating from each other. Therefore, the source S and the drain D are defined symmetrically to the gates FG and CG and the channel CH.

Figure 15:
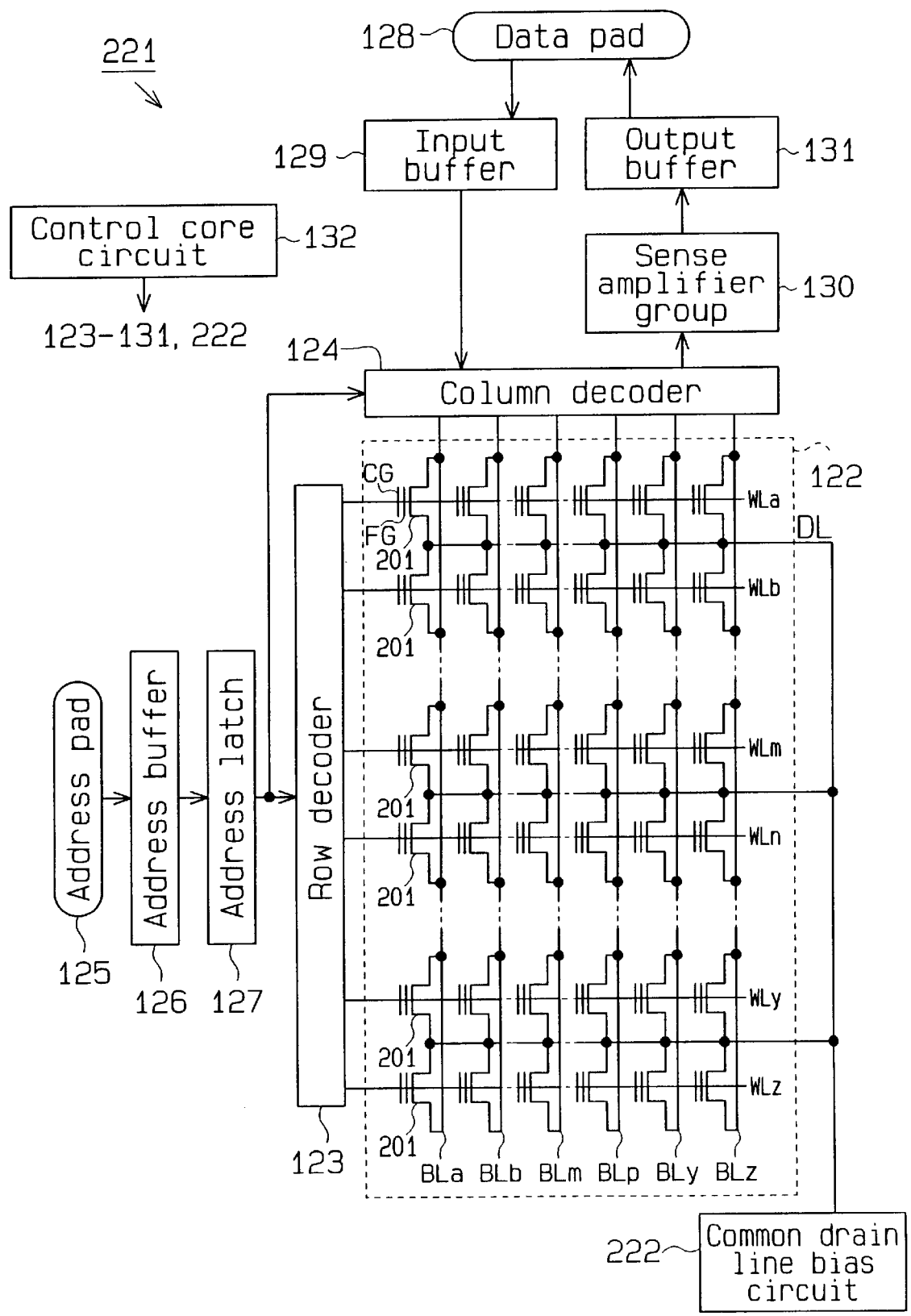
FIG. 15 is a block diagram showing a conventional flash EEPROM having a plurality of stacked gate memory cells in FIG. 14.

FIG. 15 is a block diagram showing a conventional flash EEPROM 221 having a plurality of stacked gate memory cells 201. This flash EEPROM 221 mainly differs from the conventional flash EEPROM 121 shown in FIG. 4 in the following three points:

(1) The memory cell array 122 has a plurality of stacked gate memory cells 201 arranged in a matrix form at the intersections between a plurality of word liens WLa–WLz and a plurality of bit lines BLa–BLz.

(2) The sources S of the individual memory cells 201 aligned in individual rows are commonly connected to the associated bit lines BLa–BLz.

(3) The drains D of all the memory cells 201 are connected to a common drain line bias circuit 222 via a common drain line DL. The common drain line bias circuit 222 controls the voltage to be applied to the common drain line DL in accordance with the individual operational mode under the control of a control core circuit 132.

The names for the source S and the drain D of the stacked gate memory cell 201b are determined based on the reading operation; the terminal to which a high voltage is applied in the reading operation is called "drain" while the terminal to which a low voltage is applied is called "source". The same applies to the determination of the names for those terminals, the source S or the drain D, even in the writing operation and the erasing operation.

The individual operational modes (erase mode, write mode and read mode) of the conventional flash EEPROM 221 will now be discussed referring to FIG. 16.

(a) Erase Mode

In the erase mode, all the bit lines BLa–BLz are set in the open state and a voltage of the ground level is applied to the selected word line WLm. The common drain line bias circuit 222 applies +12 V to the drains D of all the memory cells 201 via the common drain line DL. As a result, the FN tunnel current flows and the electrons in the floating gates FG are drained toward the drains D to erase data stored in the memory cells 201. This erasing operation is executed for all the memory cells 201 connected to the selected word line WLm. Erasure (block erasure) may be performed on all the memory cells 201 connected to a plurality of word lines WLa–WLz which are selected simultaneously.

(b) Write Mode

In the write mode, +12 V is applied to the selected word line WLm (control gate CG) and the voltage of the ground level is applied to the non-selected word lines WLa–WLl and WLn–WLz. +5 V is applied to the selected bit line BLm (source S), and the voltage of the ground level is applied to the non-selected bit lines BLa–BLl and BLn–BLz. The common drain line bias circuit 222 maintains the voltage to be applied to the drains D of all the memory cells 201 via the common drain line DL, at the ground level. Consequently, the electric potentials of the floating gates FG are pulled up and hot electrons produced in the vicinity of the sources S are supplied into the floating gates FG. As a result, charges are stored in the floating gates FG of the selected memory cells 201 and 1-bit data is written there.

(c) Read Mode

In the read mode, +5 V is applied to the selected word line WLm and the voltage of the ground level is applied to the non-selected word lines WLa–WLl and WLn–WLz. The voltage of the ground level is applied to all the bit lines BLa–BLz. The common drain line bias circuit 222 applies +5 V to the drains D of all the memory cells 201 via the common drain line DL. As a result, the cell current that flows to the source S of any erased memory cell 201 from the drain D thereof becomes greater than the cell current flowing in any memory cell 201 in the written state. By utilizing this phenomenon, the data value "1" is read from the erased memory cell 201 and the data value "0" is read from the written memory cell 201.

Figure 2:
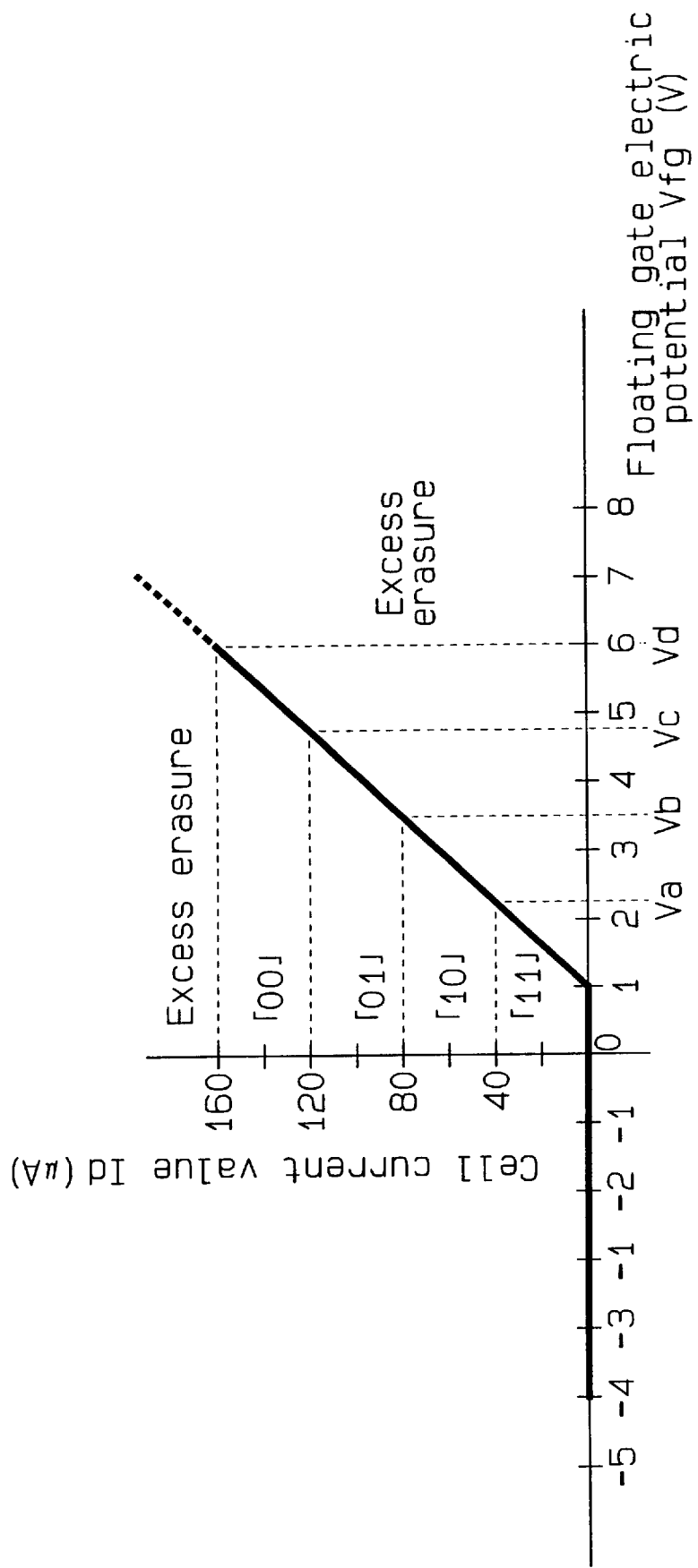
FIG. 2 is a characteristic graph showing the relationship between the cell current that flows in stacked gate memory cells and the electric potential of a floating gate in each memory cell.

In the conventional flash EEPROM 221, since the amount of charge in the floating gate FG, or the potential thereof, is controlled by adjusting the time for the writing operation, the cell current value in the read mode can be set arbitrarily. As shown in FIG. 2, for example, the data value "11" is associated with the range of the cell current value Id of less than 40 μA. The data value "10" is associated with the range of the cell current value Id of equal to or greater than 40 μA and less than 80 μA. The data value "01" is associated with the range of the cell current value Id of equal to or greater than 80 μA and less than 120 μA. The data value "00" is associated with the range of the cell current Id of equal to or greater than 120 μA and less than 160 μA. The time for the writing operation is adjusted in such a manner that the individual floating gate potentials Vfg (Va, Vb, Vc and Vd) are respectively associated with the cell current values Id (40 μA, 80 μA, 120 μA and 160 μA). In this manner, data of four values (2 bits) can be stored in a single memory cell 201.

In the stacked gate memory cells 201, the cell current value Id becomes zero when the floating gate potential Vfg is less than the threshold voltage Vth (+1 V). Further, the cell current value Id is positively proportional to the floating gate potential Vfg when the floating gate potential Vfg exceeds the threshold voltage Vth. This is because the channel CH directly below the control gate CG in the stacked gate memory cell 201, unlike the split gate memory cell 101, does not serve as a constant resistor and simply serves as a transistor. The reason why the channel CH does not serve as a constant resistor is the stacking of the control gate CG on the floating gate FG.

Third Embodiment

A stacked gate flash EEPROM according to a third embodiment of this invention will now be described with reference to the accompanying drawings. To avoid the redundant description, like or same reference numerals are given to those components in the third embodiment which are the same as the corresponding components of the first embodiment and those of the prior art shown in FIGS. 14–16.

Figure 17:
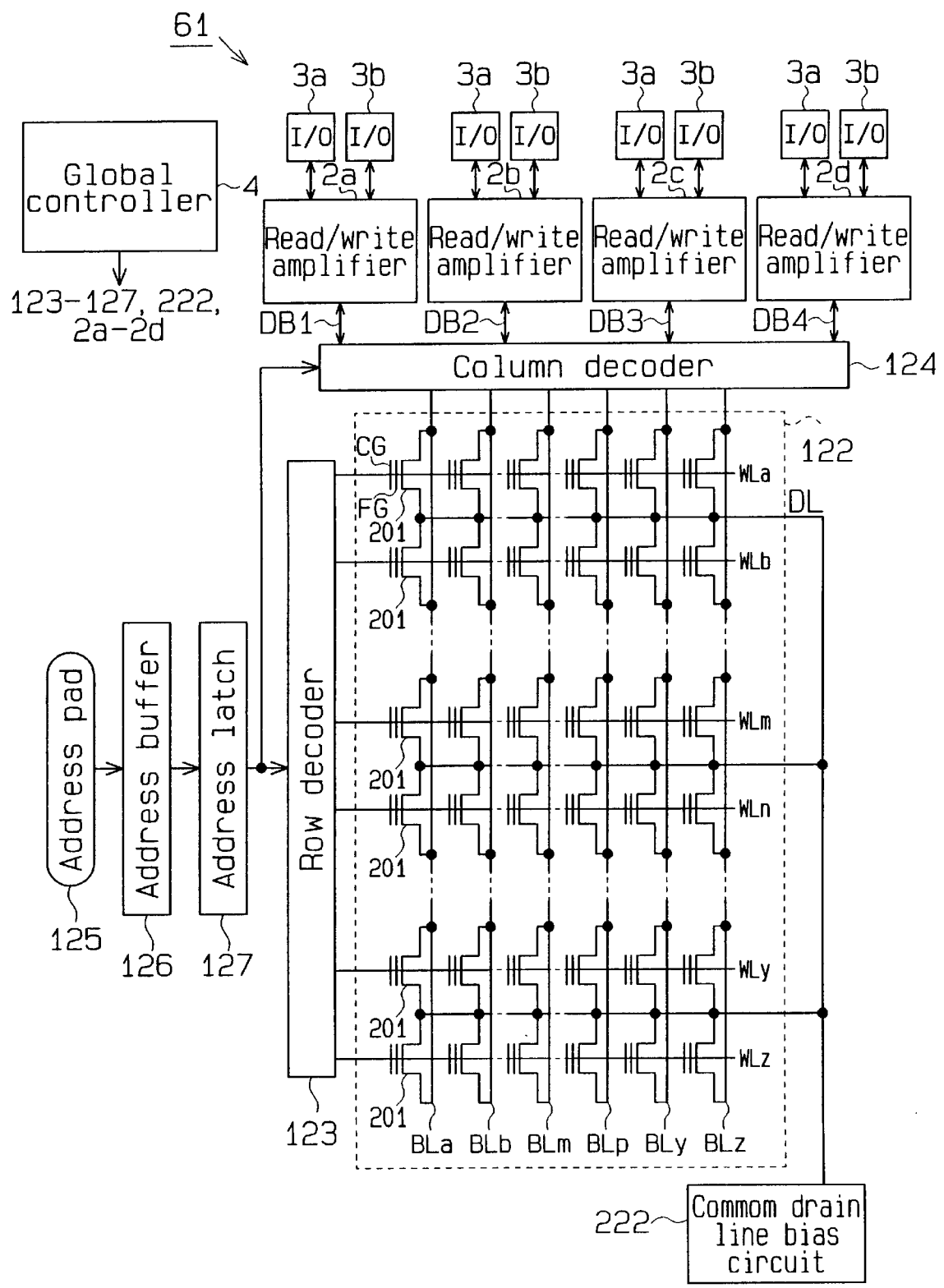
FIG. 17 is a block diagram of a flash EEPROM according to a third embodiment of the invention.

FIG. 17 is a block diagram showing a flash EEPROM 61 having a plurality of stacked gate memory cells 201 according to the third embodiment. In this third embodiment, data of four values (2 bits) can be stored in a single memory cell 201.

This flash EEPROM 61 according to the third embodiment mainly differs from the flash EEPROM 201 according to the first embodiment shown in FIG. 7 in the following four points:

(1) The memory cell array 122 has a plurality of stacked gate memory cells 201 arranged in a matrix form at the intersections between a plurality of word lines WLa–WLz and a plurality of bit lines BLa–BLz.

(2) The sources S of the individual memory cells 201 aligned in individual rows are commonly connected to the associated bit lines BLa–BLz.

(3) The drains D of all the memory cells 201 are connected to a common drain line bias circuit 222 via a common drain line DL. The common drain line bias circuit 222 controls the voltage to be applied to the common drain line DL in accordance with the individual operational mode under the control of a global controller 4.

(4) The reference voltage generator 22 selectively generates each reference voltage (+3 V, +1.5 V, 0 V, –1.5 V or –3 V) in the reading operation under the control of the local controller 13. The write voltage generator 23 generates the write voltage (+5 V) and applies this write voltage to one associated data bus in the writing operation under the control of the local controller 13.

Figure 18:
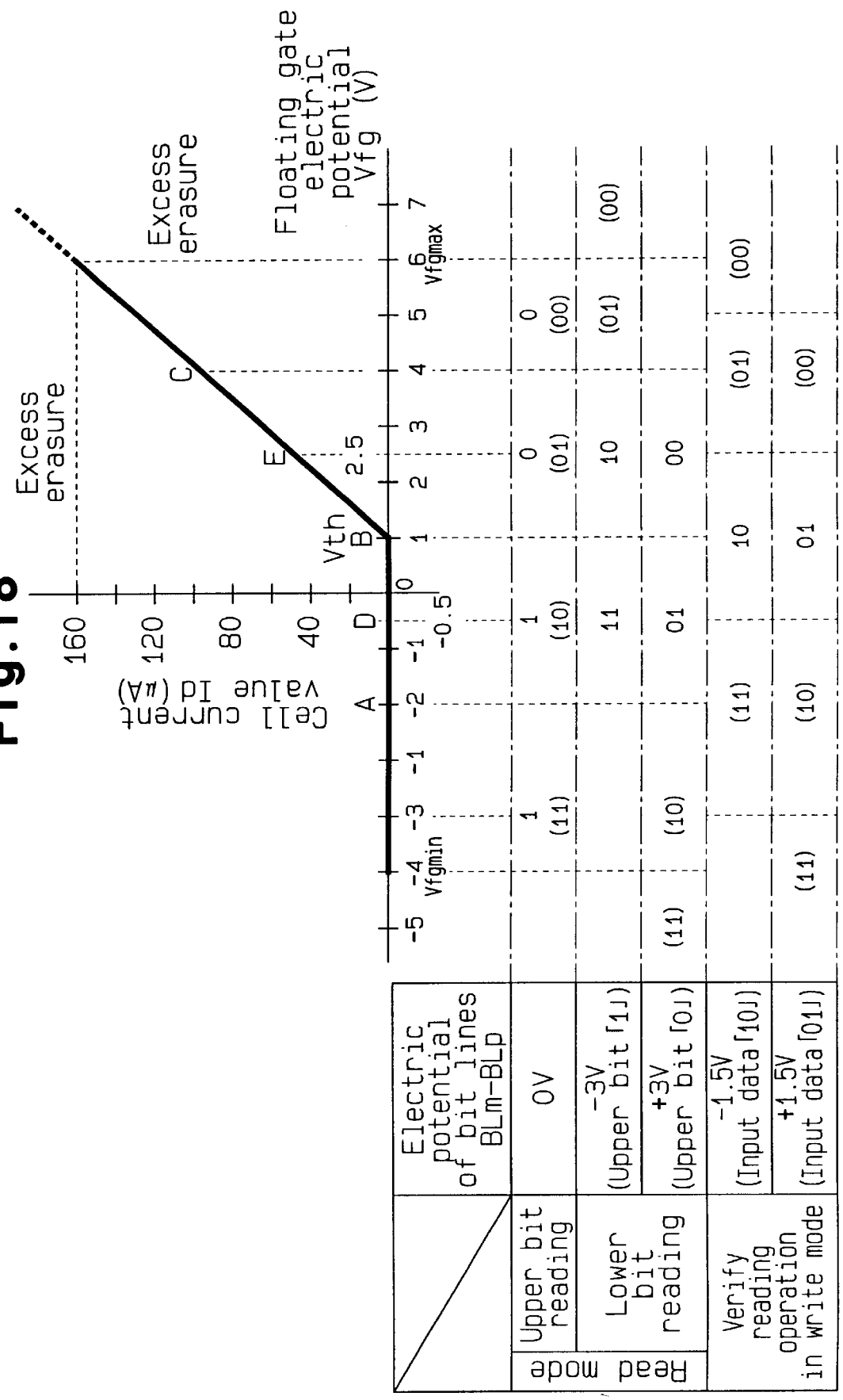
FIG. 18 is a diagram for explaining the individual operational modes of the flash EEPROM according to the third embodiment based on the characteristic graph that shows the relationship between the cell current and the electric potential of the floating gate.

FIG. 18 is a diagram including a characteristic graph showing the relationship between the cell current and the electric potential of the floating gate, based on which the individual operational modes of the flash EEPROM according to the third embodiment will be described. The relationship between the electric potential Vfg of the floating gate FG and the cell current value Id is the same as that of the prior art shown in FIG. 1.

FIG. 18 illustrates the correlation among voltages to be applied to selected bit lines BLm–BLp, read data and input data, the floating gate potential Vfg and the cell current value Id in the individual operational modes. The range of the floating gate potential Vfg of less than –2 V corresponds to a data value "11". The range of the floating gate potential Vfg of equal to or greater than –2 V and less than +1 V corresponds to a data value "10". The range of the floating gate potential Vfg of equal to or greater than +1 V and less than +4 V corresponds to a data value "01". The range of the floating gate potential Vfg of equal to or greater than +4 V corresponds to a data value "00".

Read Mode

Figure 19:
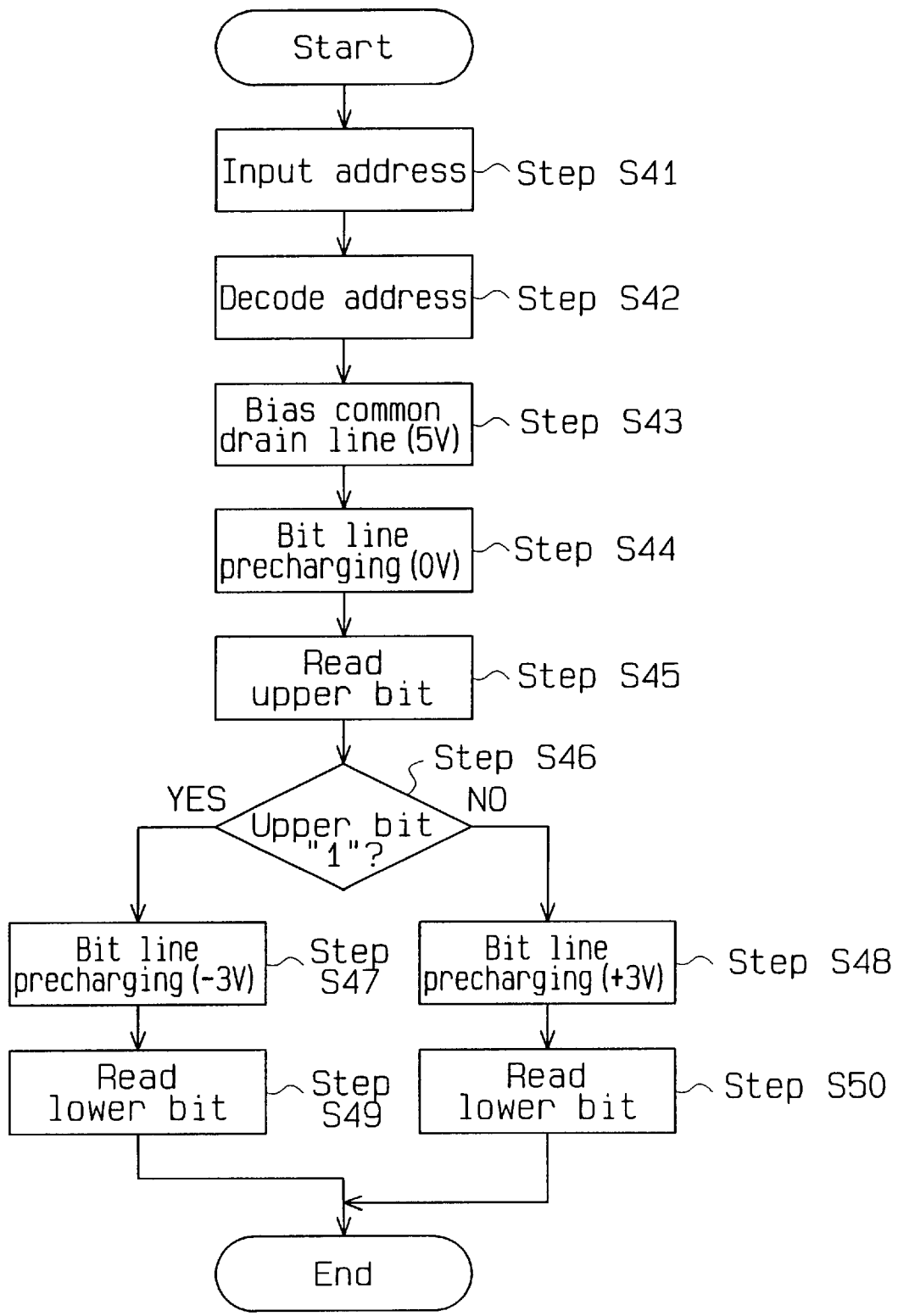
FIG. 19 is a flowchart illustrating the operation of the flash EEPROM according to the third embodiment in a read mode.

The operation in the read mode will now be discussed with reference to the flowchart in FIG. 19. Since steps S41 and S42 are the same as steps S1 and S2 in the first embodiment, their description will not be repeated.

In step S43, the common drain line bias circuit 222 applies +5 V to the drains D of all the memory cells 201 via the common drain line DL.

In step S44, bit line precharging is executed. The reference voltage generator 22 generates a voltage of 0 V under the control of the local controller 13. The current sense amplifier 21 operates to hold the voltage on the associated data bus at 0 V. As a result, the individual bit lines BLm–BLp connected to the respective data buses DB1–DB4 are precharged to 0 V.

In step S45, the upper one bit of data is read from each of the selected four memory cells 201. Each read amplifier/bit line bias circuit 14 determines the read data value of the upper one bit to be "0" when the value Id of the cell current flowing on the associated one of the data buses DB1–DB4 exceeds zero. The circuit 14 determines the read data value of the upper one bit to be "1" when the value Id of the cell current flowing on the associated data bus is zero. In other words, the data value of the upper one bit is determined to be "1" when the floating gate potential Vfg is less than the threshold voltage Vth (+1 V) of the memory cells 201. The data value of the upper one bit is determined to be "0" when the floating gate potential Vfg is equal to or greater than the threshold voltage Vth. The upper one bit of read data is transferred to the upper output latch 15 and the local controller 3. The read data latched in the upper output latch 15 is transferred to the I/O pad 3a via the upper output buffer 16a. The flow then proceeds to step S46. The data value "0" is determined when the floating gate potential Vfg is equal to or greater than the threshold voltage Vth.

In step S46, the same process as in step S5 in the first embodiment is executed. The flow proceeds to step S47 when the data value is "1" and the flow goes to step S48 when the data value is "0". Note that the individual read/write amplifiers associated with the respective data buses DB1–DB4 perform the above operation independently.

In step S47, bit line precharging is executed. The reference voltage generator 22 generates a voltage of –3 V under the control of the local controller 13. The current sense amplifier 21 operates to hold the voltage on the associated data bus at –3 V. As a result, one or more bit lines, which are connected to those of the data buses associated with the upper bit of "1", are precharged to –3 V. This precharging permits the potential at the sources S (the bit lines BLm–BLp) to fall and the floating gate potential Vfg to increase by +3 V (=0 V–(–3 V)). Consequently, the Vfg-Id characteristic curve shown in FIG. 18 is shifted substantially in the positive direction by the increase of the floating gate potential Vfg.

In step S49, the lower one bit of data is read from those of the selected four memory cells 201 which are associated with the upper bit of "1". Each read amplifier/bit line bias circuit 14 determines the data value of the lower one bit of data in accordance with the presence or absence of the cell current Id that flows on the data buses DB1–DB4, as done in step S45. At this time, the electric potential of the floating gate FG has been pulled up by +3 V. Therefore, the range of the floating gate potential corresponding to the cell current of zero amperes is shifted in the positive direction by +3 V. The range of the floating gate potential is equal to or less than the threshold voltage Vth (+1 V) of the memory cells 201. Consequently, a point A on the Vfg-Id characteristic curve shown in FIG. 18, where the floating gate potential Vfg is –2 V, is shifted to (or matched with) a point B of the threshold voltage Vth.

When the cell current value Id is zero, therefore, the data value "11" is read out. The data value "11" corresponds to the range of the floating gate potential Vfg that is less than −2 V. When the cell current value Id exceeds zero, the data value "10" is read out. The data value "10" corresponds to the range of the floating gate potential Vfg that is equal to or greater than −2 V and less than +1 V. The read mode is then terminated.

In step S48, bit line precharging is executed. The reference voltage generator 22 generates a voltage of +3 V under the control of the local controller 13. The current sense amplifier 21 operates to hold the voltage on the associated data bus at +3 V. As a result, one or more bit lines, which are connected to those data buses DB1–DB4 associated with the upper bit "0", are precharged to +3 V. This precharging permits the potentials at the sources S (the bit lines BLm–BLp) to rise and the floating gate potential Vfg to drop by −3 V (=−3 V−0 V). Consequently, the Vfg-Id characteristic curve shown in FIG. 18 is shifted substantially in the negative direction by the drop of the floating gate potential Vfg.

In step S50, as in step S49, the lower one bit of data is read from those of the selected four memory cells 201 that are associated with the upper bit of "0". In this reading operation, as the potentials at the bit lines BLm–BLp rise by +3 V, the potentials at the sources S rise and the electric potential of the floating gate FG drops by −3 V. As shown in FIG. 18, therefore, the range of the floating gate potential Vfg corresponding to the increased cell current value Id is shifted in the negative direction by +3 V. The range of the floating gate potential Vfg is equal to or greater than the threshold voltage Vth (+1 V). Consequently, a point C on the Vfg-Id characteristic curve, where the floating gate potential Vfg is +4 V, is shifted to (or matched with) the point B of the threshold voltage Vth.

When the cell current value Id is zero, therefore, the data value "01" is read out. The data value "01" corresponds to the range of the floating gate potential Vfg that is equal to or greater than +1 V and less than +4 V. When the cell current value Id exceeds zero, the data value "00" is read out. The data value "00" corresponds to the range of the floating gate potential Vfg that is equal to or greater than +4 V. The read mode is then terminated. Steps S47 and S48 in FIG. 19 may be executed synchronously. Likewise, steps S49 and S50 may be executed synchronously.

Write Mode

The operation in the write mode will now be discussed with reference to the flowchart in FIG. 20. In the write mode, step S61, which is the same as step S21, and step S62, which is the same as step S22, are performed. In step S62, the row decoder 123 applies +12 V to one word line WLm selected according to the row address and applies the voltage of the ground level to the non-selected word lines WLa–WLl and WLn–WLz.

In step S63, the common drain line bias circuit 222 applies the voltage of the ground level to the drains D of all the memory cells 201 via the common drain line DL. In this write mode, since a low voltage is applied to the drains D, the drains D are called "sources".

When the value of write data is not "00" in step S65, the flow proceeds to step S66. When the value of write data is "00", all the memory cells 201 have been erased and their data values have become "00" prior to the write mode, no writing operation is performed and the write mode is terminated.

When the data value is "10" in step S66, the flow proceeds to step S67, and the flow proceeds to step S68 otherwise.

In step S67, writing of the data value "10" is performed. The write voltage generator 23 applies +5 V to the associated data bus under the control of the local controller 13. As a result, one or more bit lines, which are connected to those of the data buses DB1–DB4 associated with the input data "10", are precharged to +5 V. Consequently, the electric potential Vfg of the floating gate FG is pulled up so that hot electrons produced in the vicinity of the sources S (which are called "drains" in this case) are supplied into the floating gates FG. As charges are stored in the floating gate FG of any erased memory cell 201 the floating gate potential Vfg of which is equal to or greater than +4 V, the floating gate potential Vfg falls. Therefore, the writing of the data value "10" is executed for a given time (several hundred nanoseconds to several microseconds) in which the floating gate potential Vfg becomes equal to or greater than −2 V and less than +1 V. In other words, the writing operation is stopped when the floating gate potential Vfg becomes equal to or greater than −2 V and less than +1 V.

To accurately write the data value "10" in the memory cells 201 whose Vfg-ID characteristics vary, it is preferable that the writing operation be stopped when the floating gate potential Vfg becomes −0.5 V or the middle value between −2 V and +1 V. In this case, the flash EEPROM 61 having any memory cell 201 in which the data value "10" cannot be written, even though the writing operation was stopped when the floating gate potential Vfg became −0.5 V, is determined as a defect.

In step S69, bit line precharging for verify reading is executed. The reference voltage generator 22 generates a voltage of −1.5 V under the control of the local controller 13. The current sense amplifier 21 operates to maintain the voltage on the associated data bus at −1.5 V. As a result, one or more the bit lines, which are connected to those of the data buses DB1–DB4 associated with the input data "10", are precharged to −1.5 V. This precharge voltage (−1.5 V) is set to the middle value between the precharge voltage (−3 V) in step S47 and the precharge voltage (0 V) in step S44 both in the read mode.

When −1.5 V is applied to the bit lines BLm–BLp, the electric potential of the floating gate FG is pulled up by +1.5 V (=0 V−(−1.5 V)). Consequently, the range of the floating gate potential Vfg corresponding to the cell current of zero amperes is shifted in the positive direction by +1.5 V, as shown in FIG. 18. As a result, the point A where the floating gate potential Vfg is −2 V is shifted to a point D of −0.5 V. The point B of the threshold voltage Vth is shifted to a point E of +2.5 V and the point D of −0.5 V is shifted to the point B.

In step S70, write data is read from those of the selected four memory cells 201 associated with the input data "10" for verification. In step S71, each read amplifier/bit line bias circuit 14 determines whether or not the cell current value Id exists for the associated memory cells 201. Through this determination, it is determined if the floating gate potential Vfg lies at the intermediate point D (−0.5 V) between the point A (−2 V) and the point B (+1 V) and if the data value "10" has been written. When the cell current value Id is zero, it is determined that the data value "10" has been written in the memory cells 201, and the write mode will then be terminated. When the cell current value Id is not zero, steps S67 and S69–S71 are repeated until the cell current value Id becomes zero, after which the write mode will be terminated.

When the data value is "01" in step S68, the flow proceeds to step S72, and, when the data value is "11", the flow goes to step S73.

In step S72, the same writing operation as done in step S67 is performed. This writing operation is stopped when the floating gate potential Vfg becomes equal to or greater than +1 V and less than +4 V in order to write the data value "01" in the associated memory cells 201.

To accurately write the data value "01" in memory cells having varying Vfg-Id characteristics, it is preferable that the writing operation be stopped when the floating gate potential Vfg becomes +2.5 V, which is the middle value between +1 V and +4 V. The flash EEPROM 61 having any memory cell 201 in which the data value "01" cannot be written, even though the writing operation was stopped when the floating gate potential Vfg became +2.5 V, is determined as a defect.

In the next step S74, bit line precharging for verify reading is executed. The reference voltage generator 22 generates a voltage of +1.5 V under the control of the local controller 13. The current sense amplifier 21 operates to hold the voltage on the associated data bus at +1.5 V. As a result, one or more of the bit lines connected to those of the data buses DB1–DB4 associated with the input data "01", are precharged to +1.5 V. This precharge voltage (+1.5 V) is set to the middle value between the precharge voltage (+3 V) in step S48 and the precharge voltage (0 V) in step S44, both in the read mode.

When +1.5 V is applied to those of the bit lines BLm–BLp associated with the input data "01", the electric potential of the floating gate FG is pulled down by −1.5 V (=0 V−1.5 V). Consequently, the range of the floating gate potential Vfg corresponding to the increased cell current value is shifted in the negative direction by −1.5 V, as shown in FIG. 18. As a result, the point B of the threshold voltage Vth is shifted to the point D of −0.5 V. The point C of +4 V is shifted to the point E of +2.5 V and the point E of +2.5 V is shifted to the point B.

In step S75, as in step S70, write data is read from the selected four memory cells 201 for verification. In step S76, each read amplifier/bit line bias circuit 14 determines whether or not the cell current value Id exists for each of the associated four memory cells 201. Through this determination, it is determined if the floating gate potential Vfg lies at the intermediate point E (+2.5 V) between the point B (+1 V) and the point C (+4 V) and if the data value "01" has been written. When the cell current value Id is zero, it is determined that the data value "01" has been written in the memory cells 201, and the write mode will then be terminated. When the cell current value Id is not zero, steps S72 and S74–S76 are repeated until the cell current value Id becomes zero after which the write mode will be terminated.

In step S73, as in step S67, writing of the data value "11" in the memory cells 201 is performed, after which the write mode will be terminated. The time for this writing operation is set long enough for the data value "11" to be written in the memory cells 201. That is, the writing operation is stopped when the floating gate potential Vfg becomes less than −2 V. In view of a variation in the Vfg-Id characteristic curves of the individual memory cells, however, it is preferable that the writing operation be stopped when the floating gate potential Vfg reaches a level sufficiently lower than −2 V. The writing time in step S73 therefore should be set to the optimal time based on the results of experiments on the writing operation in consideration of a variation in the Vfg-Id characteristic curves. In this embodiment, no verify reading operation is performed for this input data value "11". Steps S67, S72 and S73 in FIG. 20 may be executed synchronously. Further, steps S70 and S75 may be executed synchronously. Furthermore, steps S71 and S76 may be executed synchronously.

Although only three embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A non-volatile semiconductor memory device comprising:
   a plurality of memory cells each having a control gate, a source, a drain and a floating gate, said floating gate having an electric potential controllable by applying predetermined voltages to said control gate, said source and said drain; and
   a control unit for controlling said electric potential of said floating gate to write predetermined data, including upper bit data and lower bit data in said memory cells, each of said upper bit data and said lower bit data having one of first and second values, said predetermined data, which includes said upper bit data having said first value and said lower bit data having one of said first and second values, corresponding to one of a plurality of first electric potential ranges previously set on a higher potential side than a predetermined electric potential of said floating gate, said predetermined data, which includes said upper bit data having said second value and said lower bit data having one of said first and second values, corresponding to one of a plurality of second electric potential ranges previously set on a lower potential side than said predetermined electric potential of said floating gate, said electric potential of said floating gate being controlled so as to lie in one of said plurality of first and second potential ranges of said floating gate corresponding to said predetermined data, each of said memory cells being activatable when said floating gate has either a higher potential or a lower potential than said predetermined electric potential,
   wherein, in a read mode for reading said predetermined data written in each of said memory cells, said control unit controls said electric potential of said floating gate to determine if said upper bit data has said first value or said second value based on whether or not said memory cells have been activated and performs one of up control and down control of said electric potential of said floating gate based on a result of a decision regarding the value of said upper bit data such that one of said plurality of first and second potential ranges of said floating gate corresponding to said predetermined data to be written is shifted near said predetermined electric potential of said floating gate in order to determine if said lower bit data has said first value or said second value based on whether or not said memory cells have been activated.

2. The non-volatile semiconductor memory device according to claim 1, wherein, in a reading operation for verifying said predetermined data written in each of said memory cells, said control unit performs one of said up control and said down control of said electric potential of said floating gate such that one of said plurality of first and second potential ranges of said floating gate corresponding to said predetermined data to be written is shifted near said predetermined electric potential of said floating gate in order to determine if said predetermined data has been written based on whether or not said memory cells have been activated.

3. The non-volatile semiconductor memory device according to claim 1, wherein, in said read mode, said control unit performs one of said up control and said down control of said electric potential of said floating gate such that a characteristic curve indicating a relationship between said electric potential of said floating gate and a current flowing in each of said memory cells when activated is shifted in a positive direction or a negative direction based on a result of a decision regarding the value of said upper bit data when determining a value of said lower bit data.

4. The non-volatile semiconductor memory device according to claim 3, wherein said predetermined electric potential of said floating gate corresponds to a threshold voltage of each of said memory cells, the current flows in each of said memory cells when activated, and each pair of adjacent potential ranges in said plurality of first and second potential ranges of said floating gate are distinguished by a boundary potential; and wherein in said read mode, said control unit performs one of said up control and said down control of said electric potential of said floating gate such that said characteristic curve is shifted in a positive direction or a negative direction so that said boundary potential substantially matches with said predetermined electric potential in order to determine if said lower bit data has said first value or said second value in accordance with whether the current is flowing in each memory cell.

5. The non-volatile semiconductor memory device according to claim 2, wherein said predetermined electric potential of said floating gate corresponds to a threshold voltage of each of said memory cells, a current flows in each of said memory cells when activated, and each pair of adjacent potential ranges in said plurality of first and second potential ranges of said floating gate are distinguished by a boundary potential;

wherein, in said read mode, said control unit performs one of said up control and said down control of said electric potential of said floating gate such that a characteristic curve indicating a relationship between said electric potential of said floating rate and current flowing in each of said memory cells when activated is shifted in a positive direction or a negative direction so that said boundary potential substantially matches with said predetermined electric potential in order to determine if said lower bit data has said first value or said second value in accordance with whether a current is flowing in each memory cell, and wherein, in said reading operation, said control unit performs one of said up control and said down control of said electric potential of said floating gate such that said characteristic curve is shifted in a positive direction or a negative direction so that a middle electric potential of one of said plurality of first and second potential ranges of said floating gate corresponding to said predetermined data to be written substantially matches with said predetermined electric potential in order to verify if said predetermined data has been written in accordance with whether the current is flowing in each memory cell.

6. The non-volatile semiconductor memory device according to claim 2, wherein a current flows in each of said memory cells when activated, and said control unit determines the value of said predetermined data written in each of said memory cells in said read mode and determines whether said predetermined data has been written in each of said memory cells in said writing operation by determining if the current is flowing in each memory cell.

7. The non-volatile semiconductor memory device according to claim 6, wherein said control unit determines the value of said predetermined data written in each of said memory cells by determining if the current is flowing in each memory cell and determining a level of a current flowing in each memory cell.

8. The non-volatile semiconductor memory device according to claim 1, wherein each of said memory cells is a split gate type having capacitive coupling between said floating gate and one of said drain and said source, and said control unit controls said electric potential of said floating gate through said capacitive coupling.

9. The non-volatile semiconductor memory device according to claim 1, wherein each of said memory cells is a stacked gate type and said control unit controls a voltage to be applied to one of said drain and said source to control said electric potential of said floating gate.

10. The non-volatile semiconductor memory device according to claim 1, further comprising a memory cell array having a plurality of bit lines, a plurality of word lines and said plurality of memory cells selectable by said plurality of bit lines and said plurality of word lines, one of said drain and said source of each of said memory cells being connected to an associated one of said bit lines; and wherein said control unit includes:
a column decoder connected to said plurality of bit lines;
a plurality of data buses connected to said column decoder, said column decoder operates to selectively connect said plurality of bit lines to said plurality of data buses;
a plurality of read/write amplifiers, respectively connected to said data buses, for controlling voltages to be applied to said data buses to write said predetermined data in each of said memory cells and controlling voltages to be applied to said data buses to read said predetermined data from each of said memory cells to thereby determine if currents are flowing on said data buses by activation of said memory cells; and
a global controller, connected to said read/write amplifiers and said column decoder, for controlling said read/write amplifiers and said column decoder.

11. The non-volatile semiconductor memory device according to claim 10, wherein each of said read/write amplifiers includes:
a reference voltage generator for generating a reference voltage; and
a sense amplifier, connected to said reference voltage generator and an associated one of said plurality of data buses, for maintaining a voltage to be applied to said associated one of said plurality of data buses at said reference voltage and outputting a signal having a voltage level corresponding to a current of each of said memory cells flowing on said associated data bus.

12. A non-volatile semiconductor memory device comprising:
a plurality of memory cells each having a control gate, a source, a drain and a floating gate, said floating gate having an electric potential controllable by applying predetermined voltages to said control gate, said source and said drain, and a control unit for controlling said electric potential of said floating gate to write predetermined data including upper bit data and lower bit data in said memory cells, each of said upper bit data and said lower bit data having one of first and second values, said predetermined data, which includes said upper bit data having said first value and acid lower bit data having said first and second values, corresponding to one of a plurality of first electric potential ranges previously set on a higher potential side than a predetermined electric potential of said floating gate, said predetermined data, which includes said upper bit data having said second value and said lower bit data having one of said, first and second values, corresponding to one of a plurality of second electric potential ranges previously set on a lower potential side than said predetermined electric potential of said floating gate, said electric potential of said floating gate being controlled so as to lie in one of said plurality of first and second potential ranges of said floating gate corresponding to said predetermined data, each of said memory cells being activatable when said floating gate has either a higher potential or a lower potential than said predetermined electric potential, wherein, in a reading operation for verifying said predetermined data written in each of said memory cells, said control unit performs one of up control and down control of said electric potential of said floating gate such that one of said plurality of first and second potential ranges of said floating gate corresponding to said predetermined data to be written is shifted near said predetermined electric potential of said floating gate in order to determine if said predetermined data has been written based on whether or nor said memory cells have been activated.

13. The non-volatile semiconductor memory device according to claim 12, wherein in said reading operation, said control unit performs one of said up control and said down control of said electric potential of said floating gate when said predetermined data to be written includes predetermined data including said upper bit data having said first value and said lower bit data having said second value or predetermined data including said upper bit data having said second value and said lower bit data having said first value.

14. The non-volatile semiconductor memory device according to claim 12, wherein, in said reading operation, said control unit performs one of said up control and said down control of said electric potential of said floating gate such that a characteristic curve indicating a relationship between said electric potential of said floating gate and a current flowing in each of said memory cells when activated is shifted in a positive direction or a negative direction in accordance with values of said upper and lower bit data included in said predetermined data to be written.

15. The non-volatile semiconductor memory device according to claim 14, wherein said predetermined electric potential of said floating gate corresponds to a threshold voltage of each of said memory cells, the current flows in each of said memory cells when activated; and wherein in said reading operation, said control unit performs one of said up control and said down control of said electric potential of said floating gate such that said characteristic curve is shifted in a positive direction or a negative direction so that a middle electric potential of one of said plurality of first and second potential ranges of said floating gate corresponding to said predetermined data to be written substantially matches with said predetermined electric potential in order to verify if said predetermined data has been written in accordance with whether the current is flowing in each memory cell.

16. A nonvolatile memory device including an array of memory cells, each of the cells for storing multivalue data, an address circuit for receiving a memory address including a row address and a column address, a row decoder connected to the address circuit for receiving the row address and selecting a word line connected to the memory cells, and a column decoder connected to the address circuit for receiving the column address and selecting a bit line connected to the memory cells, the memory device further comprising:

a plurality of read/write amplifiers connected to the column decoder by a respective plurality of data busses, wherein the column decoder selects a plurality of the bit lines corresponding to the column address and connects selected bit lines to the respective data busses;

a plurality of pairs of I/O pads, each pair of I/O pads being connected to a respective one of the read/write amplifiers, for receiving write data from an external source and providing the write data to the plurality of read/write amplifiers and for receiving read data from the column decoder by way of the read/write amplifiers; and a global controller for controlling operation of the read/write amplifiers, the row decoder, the column decoder and the address circuit, wherein:

in a write mode, each of the read/write amplifiers receives two bits of input data from the respective pair of I/O pads connected thereto and provides the input data to the column decoder by way of the data busses, and then the input data is written in a two-bit by two-bit manner into memory cells designated by a memory address, and in a read mode, data is read from the memory cells designated by a memory address and transferred to the read/write amplifiers in a two-bit by two-bit manner by way of the column decoder and the respective data busses, and then provided to the I/O pads in a bit by bit manner.

17. The memory device of claim 16, wherein each of the read/write amplifiers comprises:

an input buffer, connected to the pair of I/O pads connected to the read/write amplifier, for receiving input data from the pair of I/O pads in the write mode;

a read amplifier/bit line bias circuit, connected to the column decoder, for receiving data read from the memory array, controlling a voltage applied to the selected bit lines in the write mode, and determining a data value of the read data in the read mode;

a local controller for controlling the read amplifier/bit line bias circuit in accordance with read data and write data; and an output buffer, connected to the pair of I/O pads connected to the read/write amplifier and to the read amplifier/bit line bias circuit, for receiving the read data from the read amplifier/bit line bias circuit and transferring the read data to the pair of I/O pads.

18. The memory device of claim 17, wherein the read amplifier/bit line bias circuit comprises:

a reference voltage generator for selectively generating a plurality of individual reference voltages in a read operation, under the control of the local controller;

a current sense amplifier for detecting a current flowing in a selected memory cell and for making the voltages of the data busses equal to the reference voltages generated by the reference voltage generator; and a write voltage generator for generating a write voltage in a write operation, under the control of the local controller.

19. The memory device of claim 18, wherein the current sense amplifier comprises:

an operational amplifier having a first input terminal connected to the reference voltage generator, a second input terminal and an output terminal; and a transistor having a source connected to a supply voltage, a gate connected to the output terminal of the operational amplifier, and a drain connected to ground by way of a feedback resistor, wherein a node between the resistor and the transistor gate is connected to the operational amplifier second input terminal and to the data bus.

20. The memory device of claim 17, wherein the read amplifier/bit line bias circuit comprises:

a reference voltage generator for selectively generating a plurality of individual reference voltages in a read operation, under the control of the local controller;

a write voltage generator for generating a write voltage in a write operation, under the control of the local controller;

a first current sense amplifier including:

an operational amplifier having a first terminal connected to the reference voltage generator, a second input terminal and an output terminal, and a transistor having a source connected to a supply voltage, a gate connected to the output terminal of the operational amplifier, and a drain connected to ground by way of a feedback resistor, wherein a node between the resistor and the gate of the transistor is connected to the operational amplifier second input terminal and to the data bus;

a second current sense amplifier including:

an operational amplifier having a first terminal connected to the reference voltage generator, a second input terminal and an output terminal, and a transistor having a source connected to a supply voltage, a gate connected to the output terminal of the operational amplifier, and a drain connected to ground by way of a feedback resistor, wherein a node between the resistor and the gate of the transistor is connected to the operational amplifier second input terminal;

a comparator having a first input terminal connected to the output terminal of the operational amplifier of the first current sense amplifier, a second input terminal connected to the output terminal of the operational amplifier of the second current sense amplifier, and an output terminal connected to the local controller and the output buffer; and a reference cell block circuit connected to the second input terminal of the second current sense amplifier for generating a current corresponding to the individual reference voltages generated by the reference voltage generator and to a gate potential of a reference memory cell.

21. The memory device of claim 17, wherein the memory cells of the memory array comprise split gate type memory cells.

22. The memory device of claim 17, wherein the memory cells of the memory array comprise stacked gate type memory cells.

* * * * *